(12) United States Patent
Berthold et al.

(10) Patent No.: US 7,018,884 B2
(45) Date of Patent: Mar. 28, 2006

(54) METHOD FOR A PARALLEL PRODUCTION OF AN MOS TRANSISTOR AND A BIPOLAR TRANSISTOR

(75) Inventors: Adrian Berthold, München (DE); Josef Böck, München (DE); Jürgen Holz, München (DE); Wolfgang Klein, Zorneding (DE)

(73) Assignee: Infineon Technologies AG, München (DE)

(*) Notice: Subject to any disclaimer, the term of this patent is extended or adjusted under 35 U.S.C. 154(b) by 8 days.

(21) Appl. No.: 10/774,349

(22) Filed: Feb. 6, 2004

(65) Prior Publication Data

US 2004/0185611 A1    Sep. 23, 2004

Related U.S. Application Data

(63) Continuation of application No. PCT/EP02/07312, filed on Jul. 2, 2002.

(30) Foreign Application Priority Data

Aug. 7, 2001    (DE)    ................. 101 38 648

(51) Int. Cl.
  *H01L 21/8238*    (2006.01)
(52) U.S. Cl. .............. 438/202; 438/205; 438/206; 438/207; 438/314
(58) Field of Classification Search ............ 438/202, 438/205–207, 234–236, 314, 394
  See application file for complete search history.

(56) References Cited

U.S. PATENT DOCUMENTS

| 5,354,699 | A | | 10/1994 | Ikeda et al. |
| 5,641,692 | A | | 6/1997 | Miwa et al. |
| 5,681,765 | A | * | 10/1997 | Darmawan ............... 438/586 |
| 5,824,560 | A | | 10/1998 | Van Der Wel et al. |
| 6,103,560 | A | | 8/2000 | Suzuki |
| 6,156,595 | A | * | 12/2000 | Sawada .................. 438/202 |
| 6,303,419 | B1 | * | 10/2001 | Chang et al. ............ 438/202 |
| 6,440,787 | B1 | | 8/2002 | Yoshihisa |

FOREIGN PATENT DOCUMENTS

| EP | 0 746 032 A2 | 12/1995 |
| EP | 0 851 486 A1 | 12/1997 |

(Continued)

OTHER PUBLICATIONS

English Translation of Abstract for Japanese Publication No. 63244768.
English Translation of Abstract for Japanese Publication No. 2001203288.

(Continued)

*Primary Examiner*—Dung A. Le
(74) *Attorney, Agent, or Firm*—Maginot Moore & Beck

(57) ABSTRACT

The present invention provides a method for parallel production of an MOS transistor in an MOS area of a substrate and a bipolar transistor in a bipolar area of the substrate. The method comprises generating an MOS preparation structure in the MOS area, wherein the MOS preparation structure comprises an area provided for a channel, a gate dielectric, a gate electrode layer and a mask layer on the gate electrode layer. Further, a bipolar preparation structure is generated in the bipolar area, which comprises a conductive layer and a mask layer on the conductive layer. The mask layer is thinned in the area of the gate electrode. For determining a gate electrode and a base terminal area, common structuring of the gate electrode layer and the conductive layer is performed.

16 Claims, 21 Drawing Sheets

FOREIGN PATENT DOCUMENTS

| | | |
|---|---|---|
| JP | 63244768 | 10/1988 |
| JP | 05 006961 A | 1/1993 |
| JP | 2000-40758 | 2/2000 |
| JP | 2001203288 | 7/2001 |
| WO | WO 96/30940 | 10/1996 |
| WO | WO 96/30941 | 10/1996 |

OTHER PUBLICATIONS

"Technologie hochintegrierter Schaltungen", Widmann, Mader, Friedrich ("0,7 μm-BICMOS-Prozeβ"), pps 319-335, (17 pages).

English Translation of Abstract for Japanese Publication No. 05 006961 A.

* cited by examiner

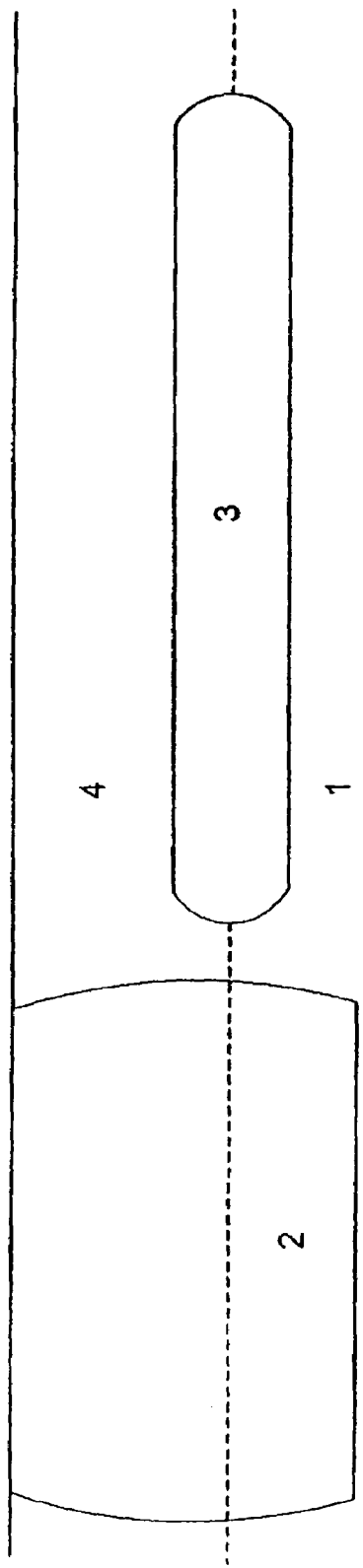
FIG 1A  NMOS transistor / NPN bipolar transistor
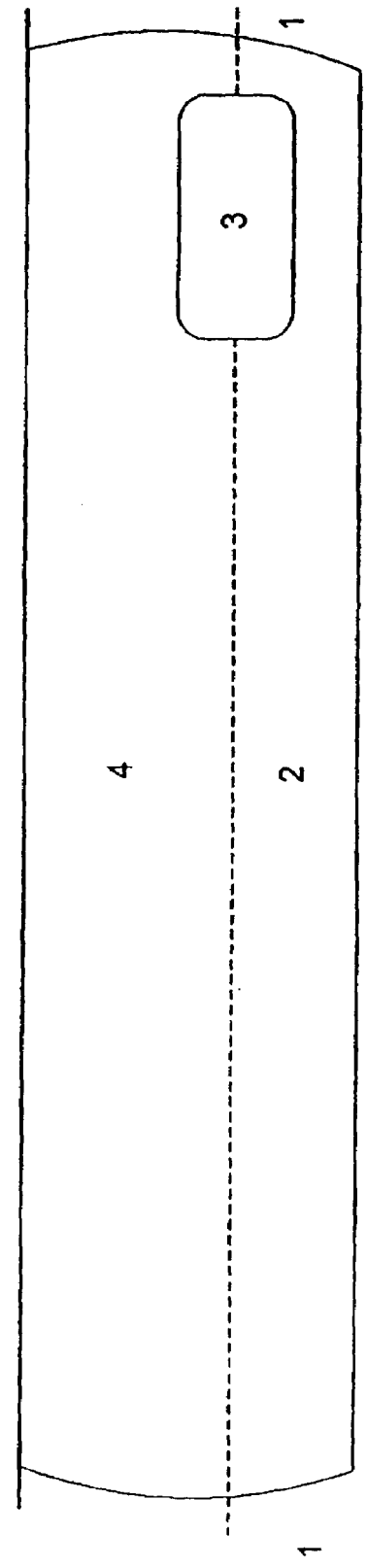
FIG 1B  vertical PNP bipolar transistor

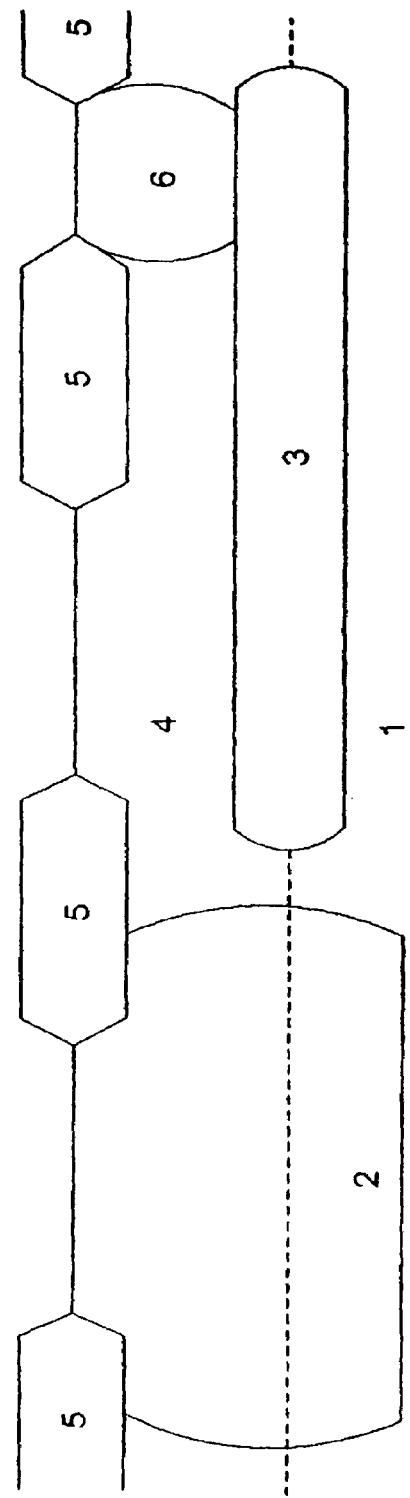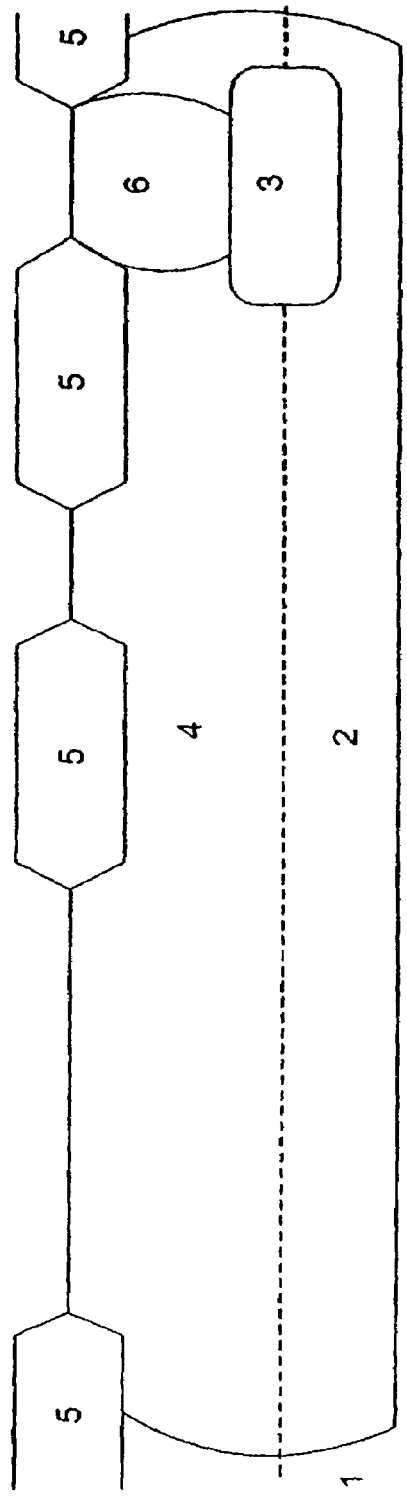

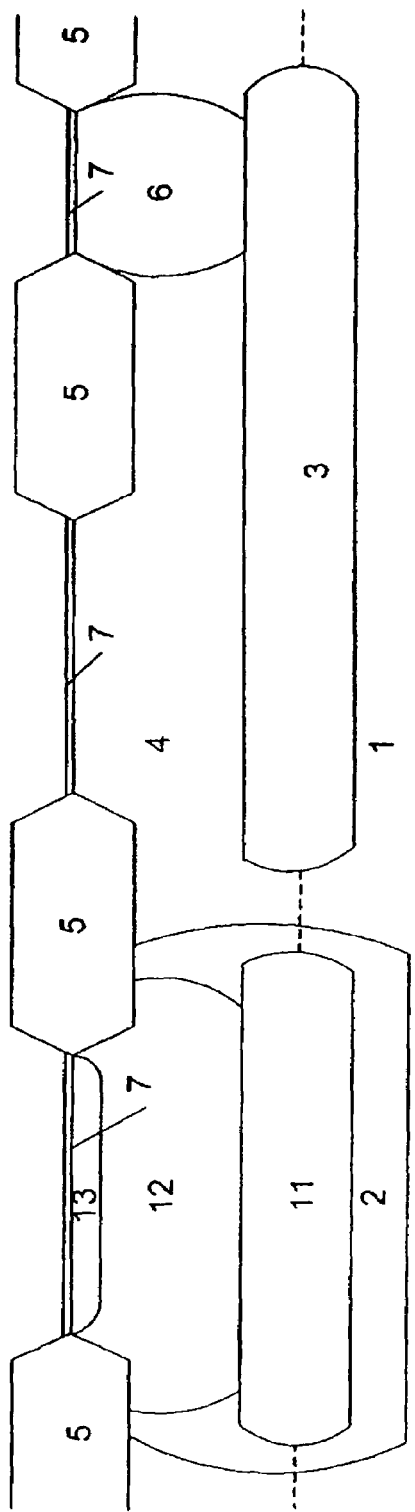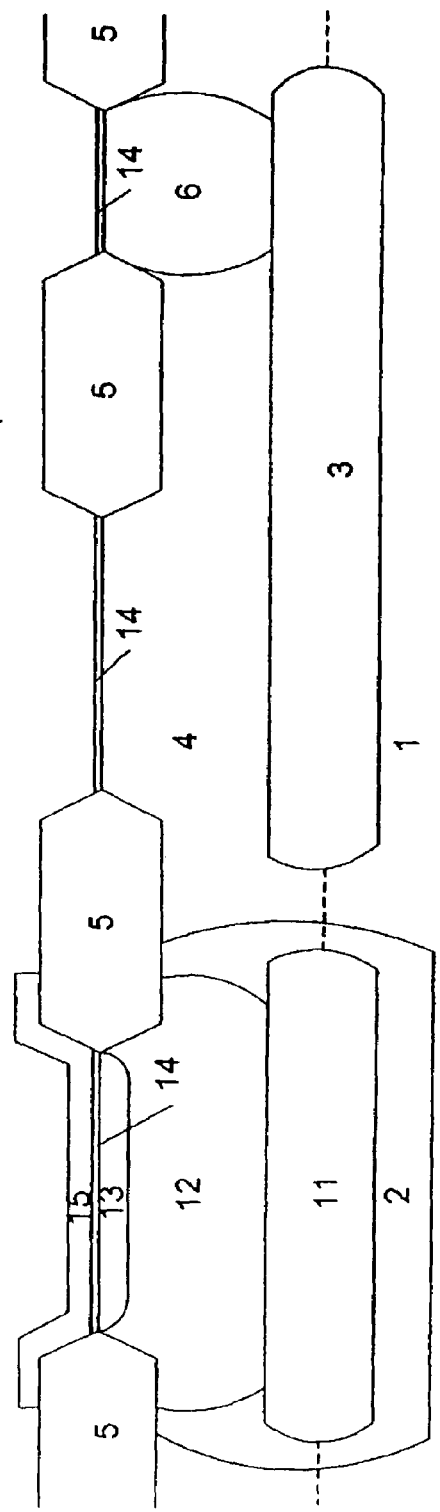

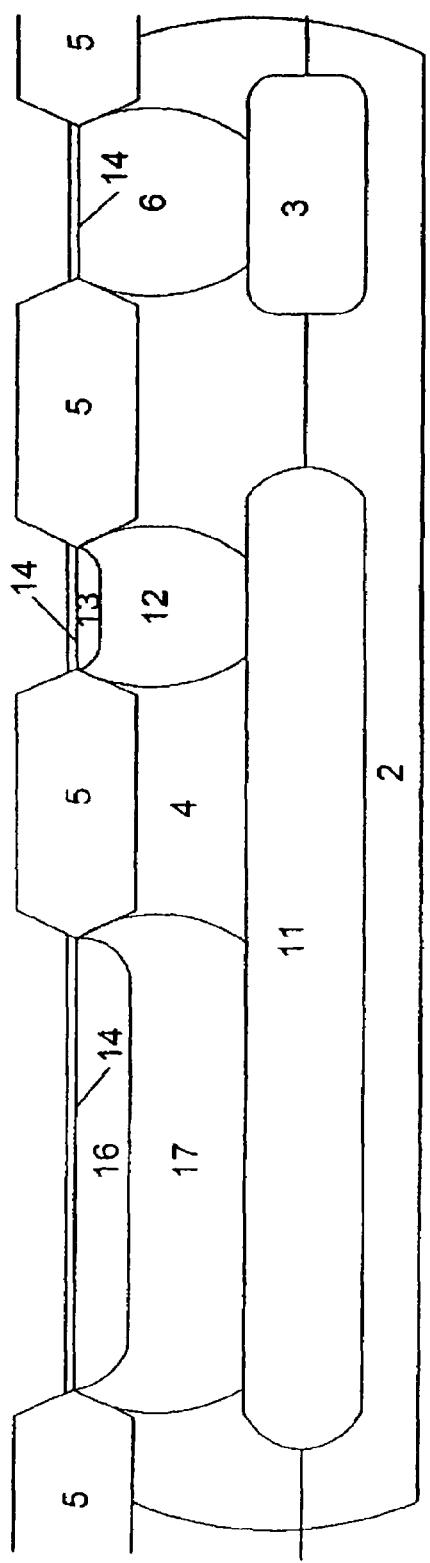
FIG 9 vertical PNP bipolar transistor
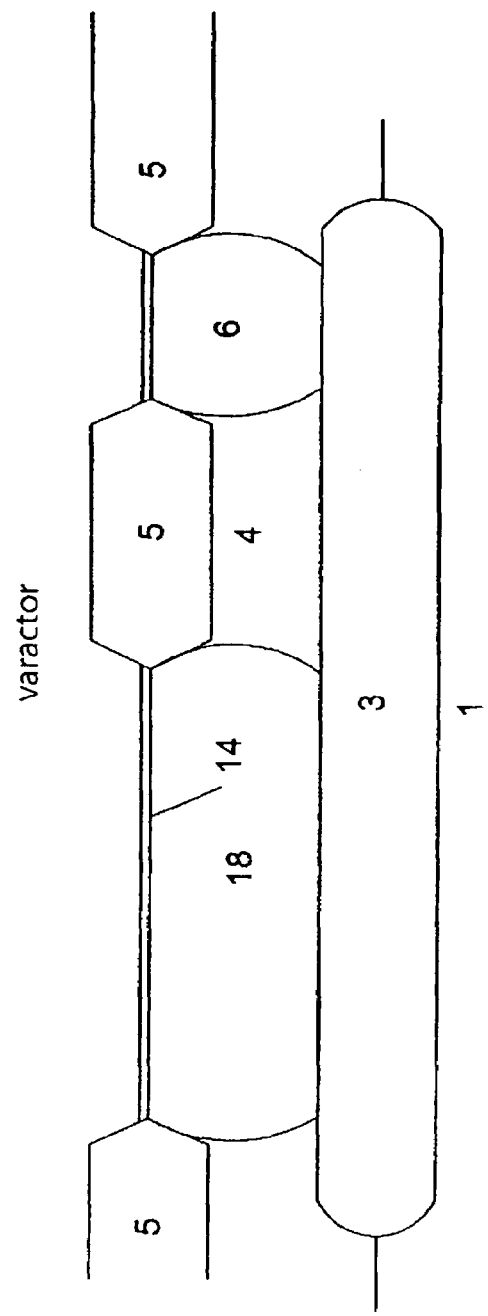
FIG 10 varactor

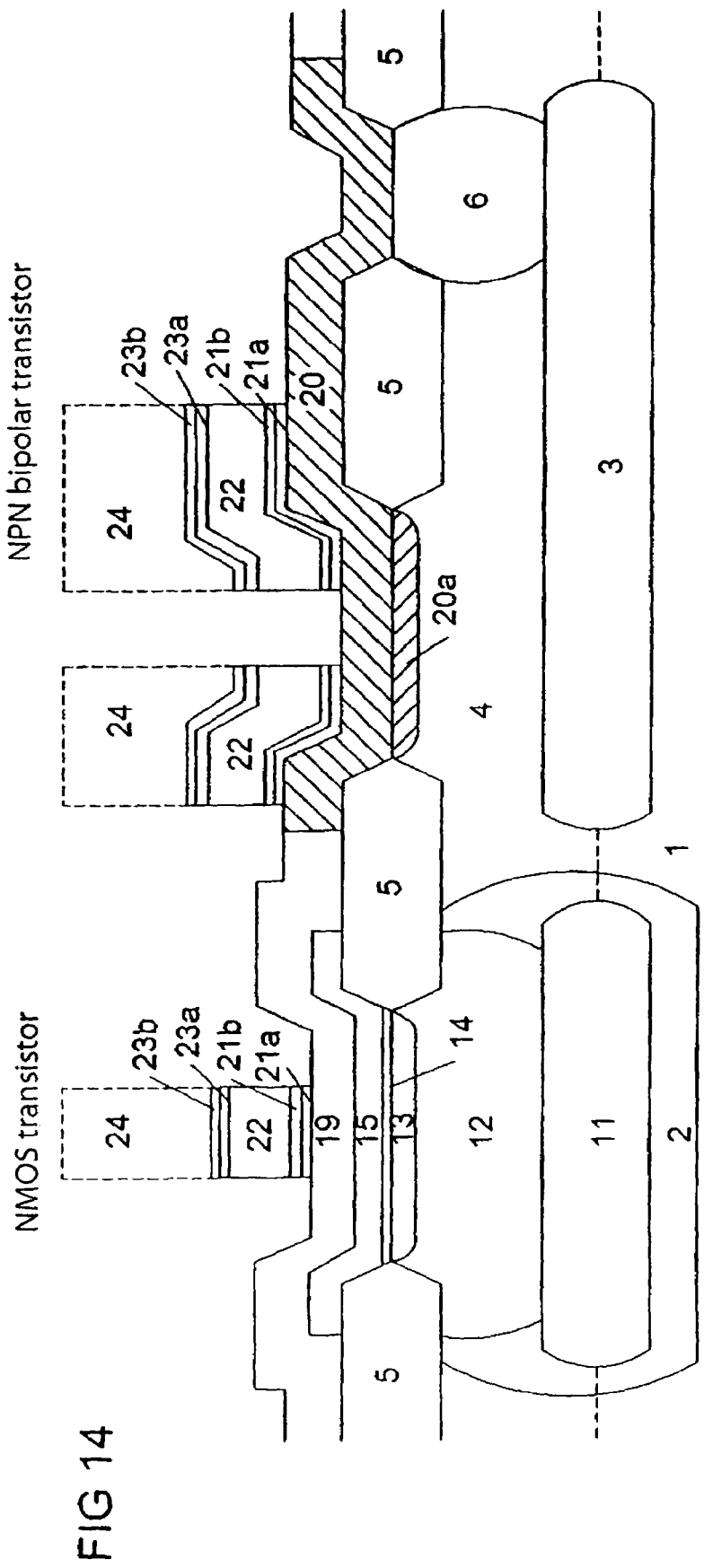

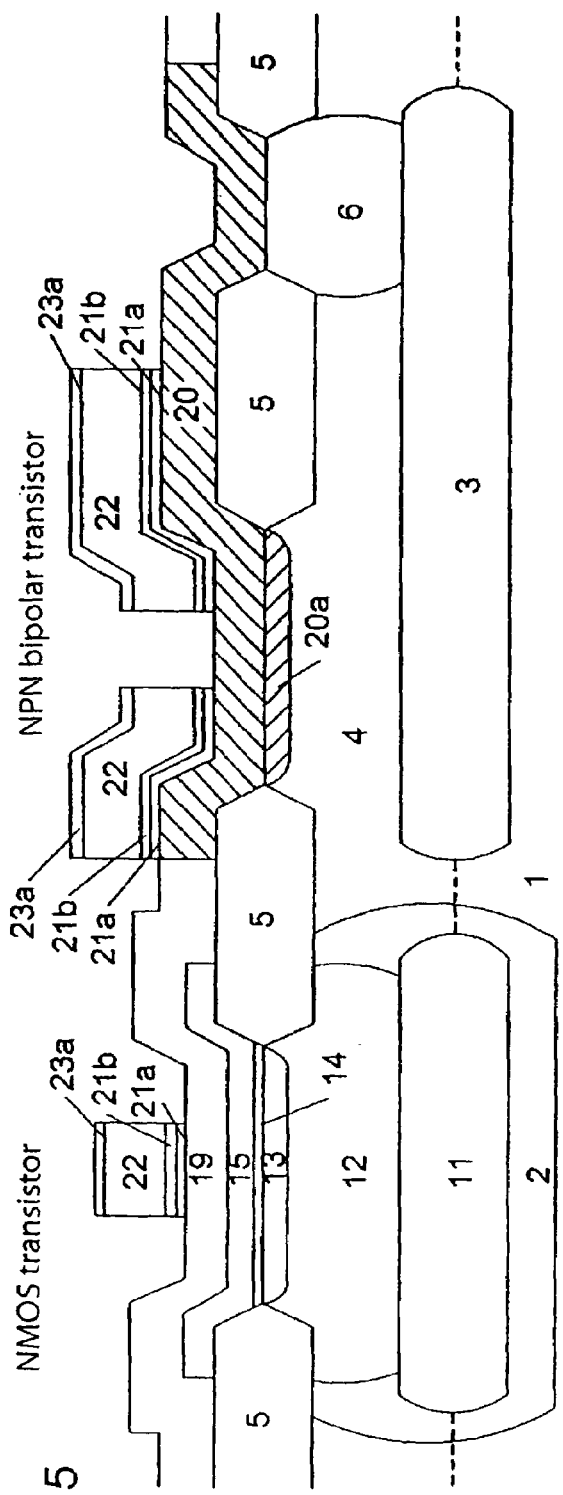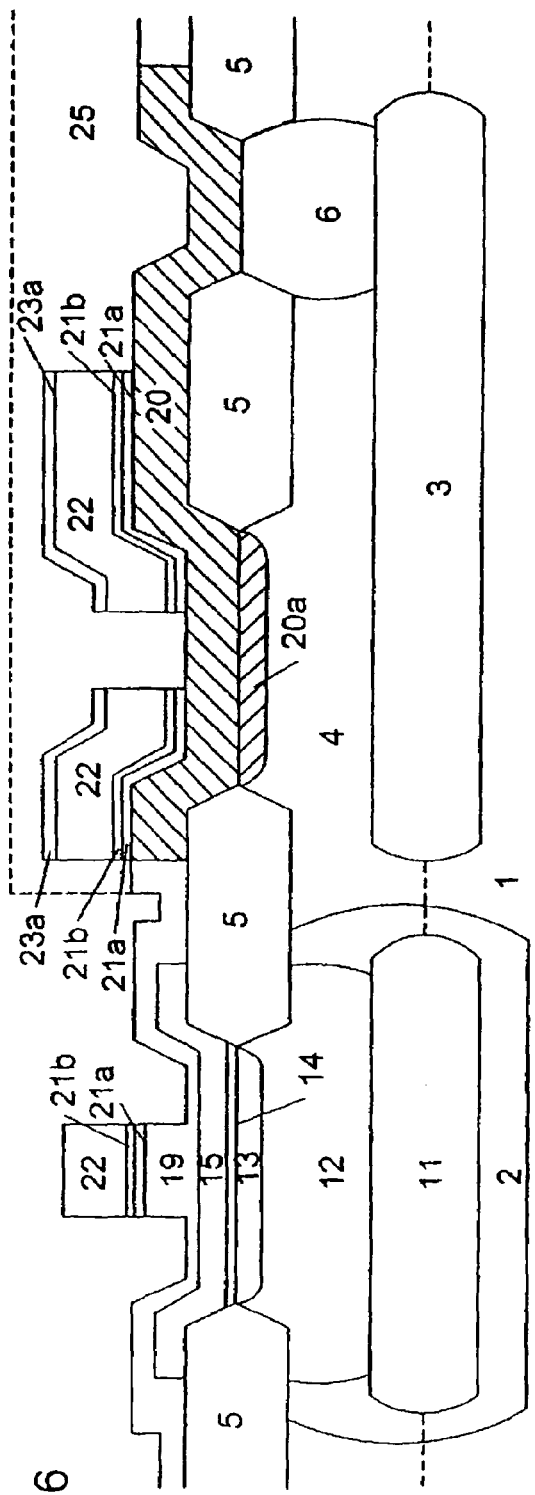

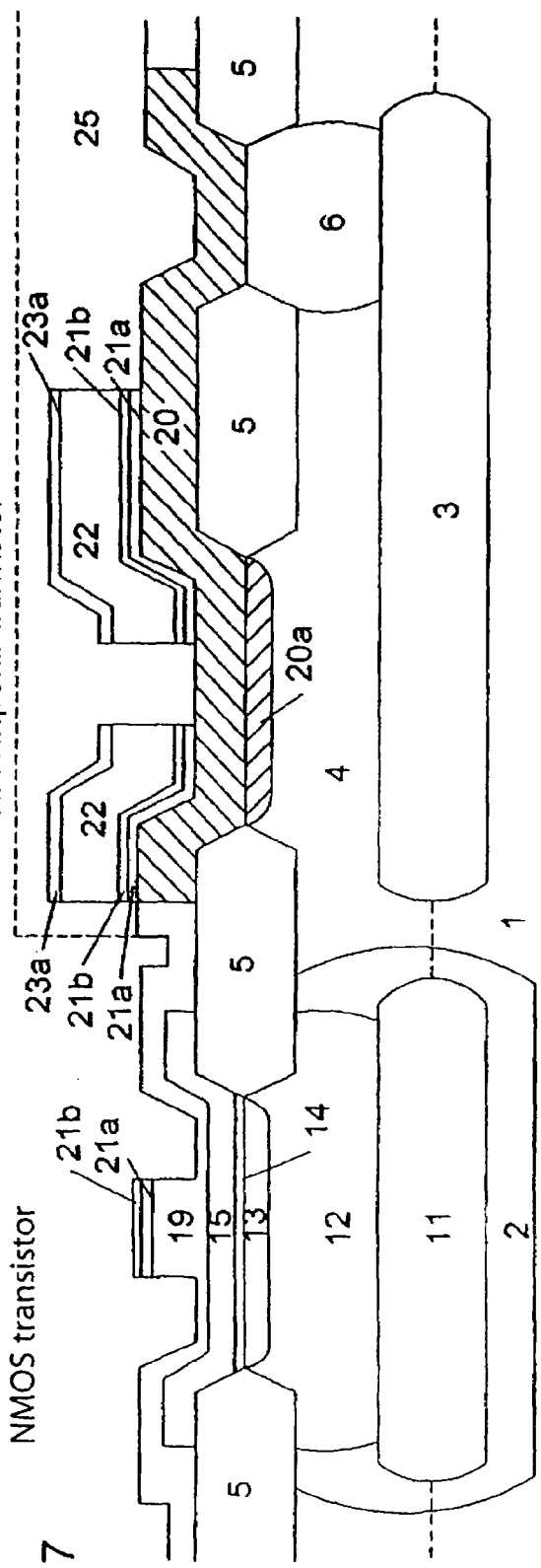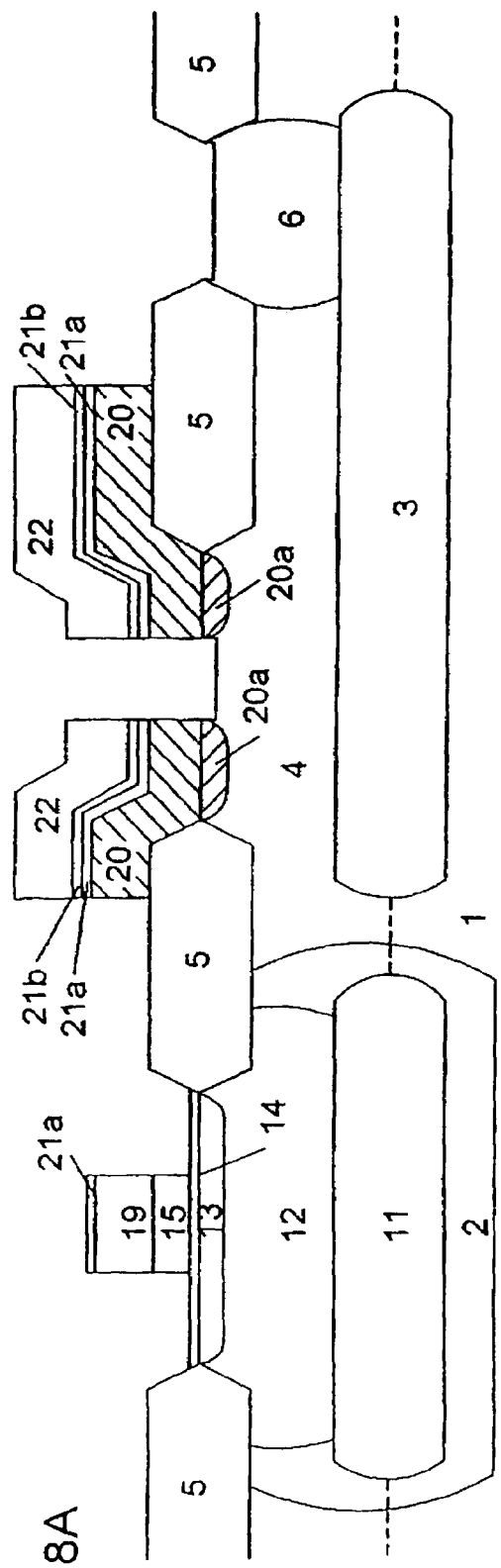
FIG 17
FIG 18A

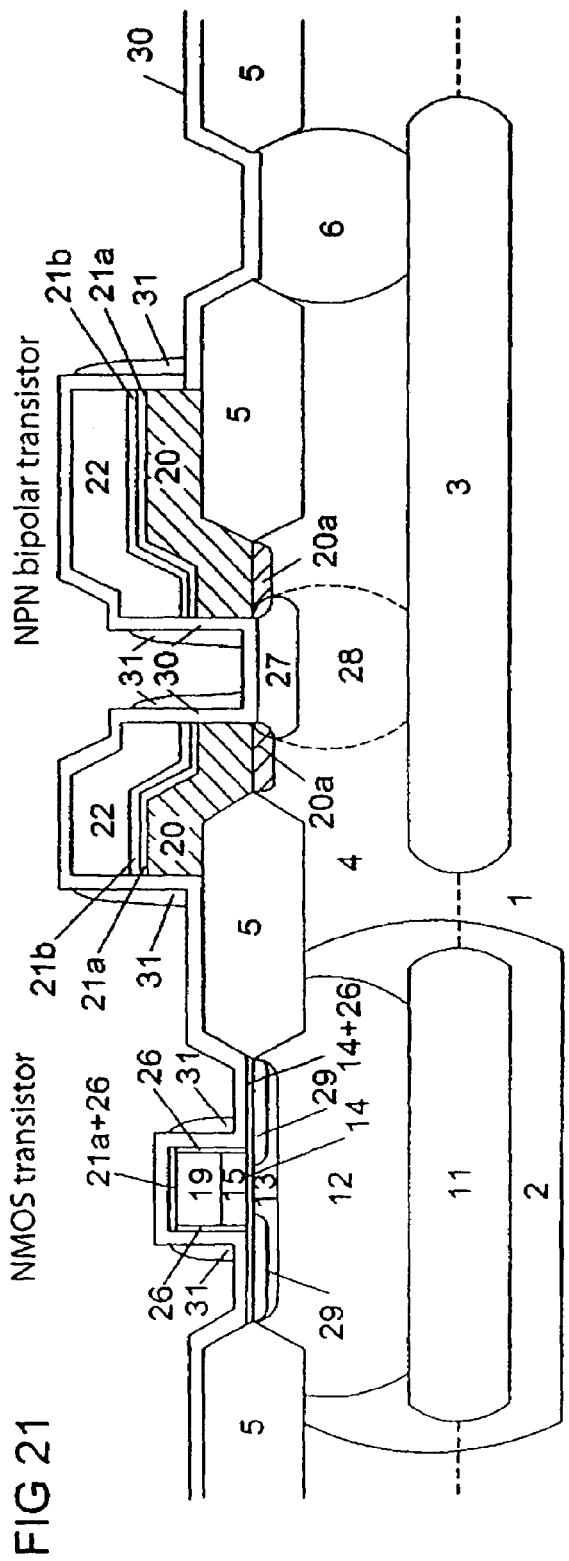
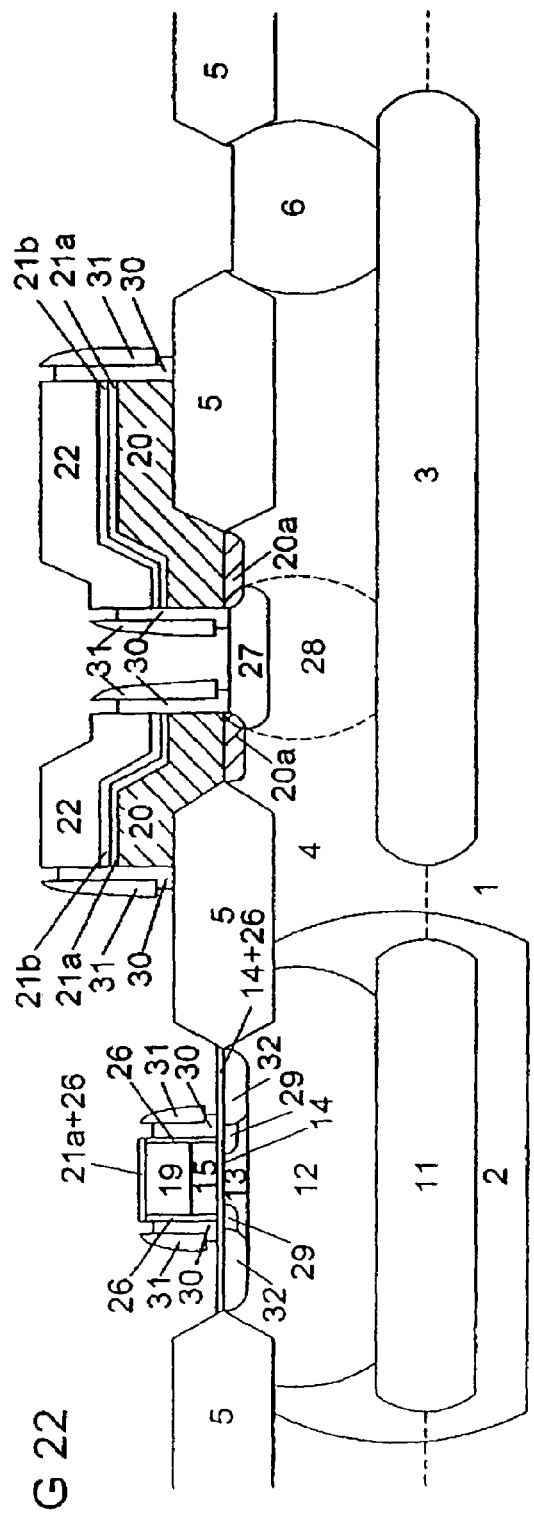

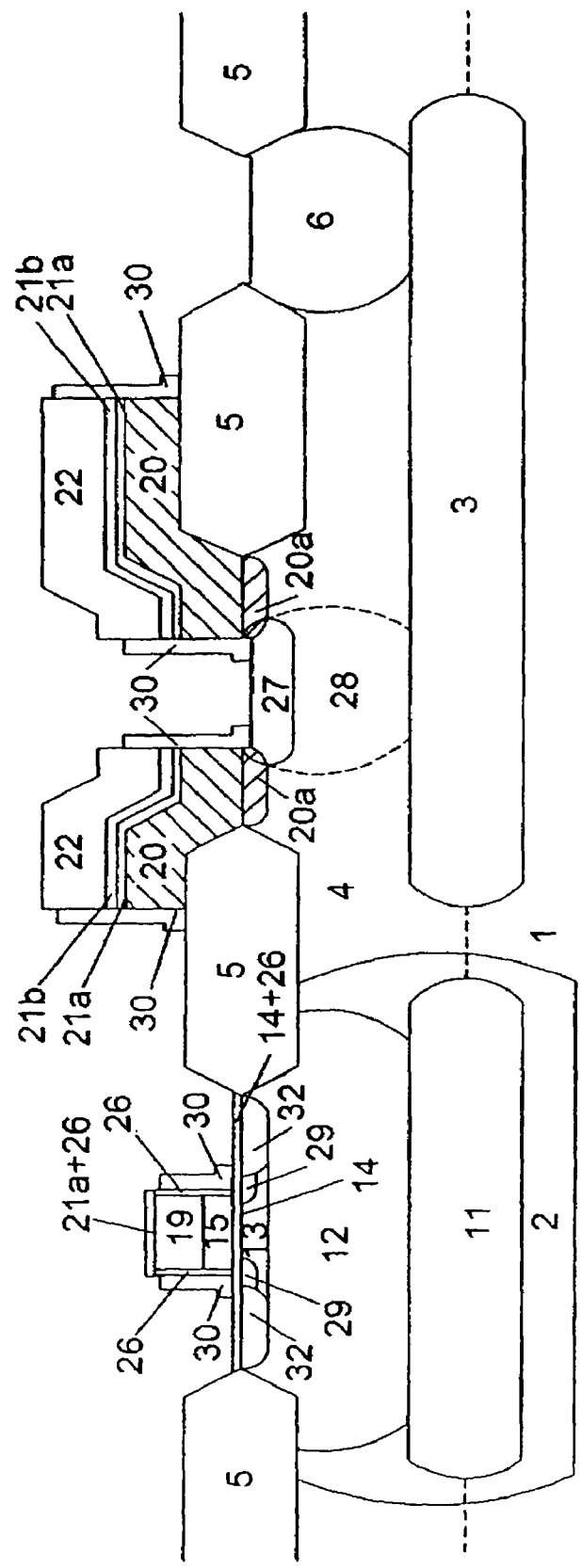

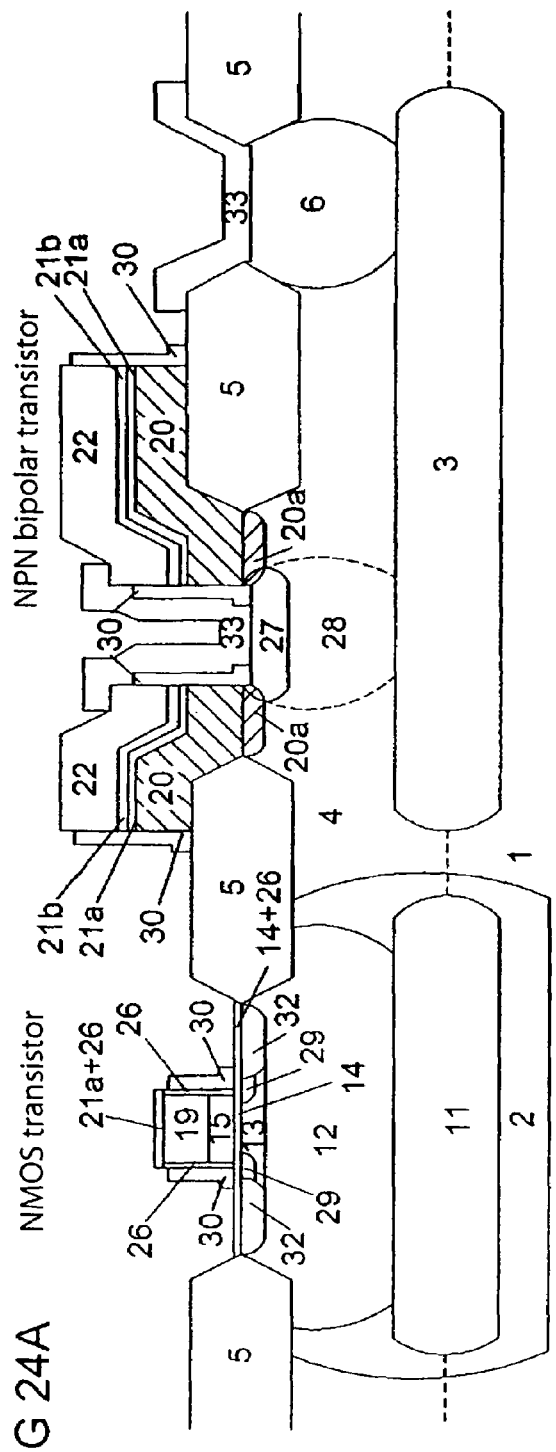
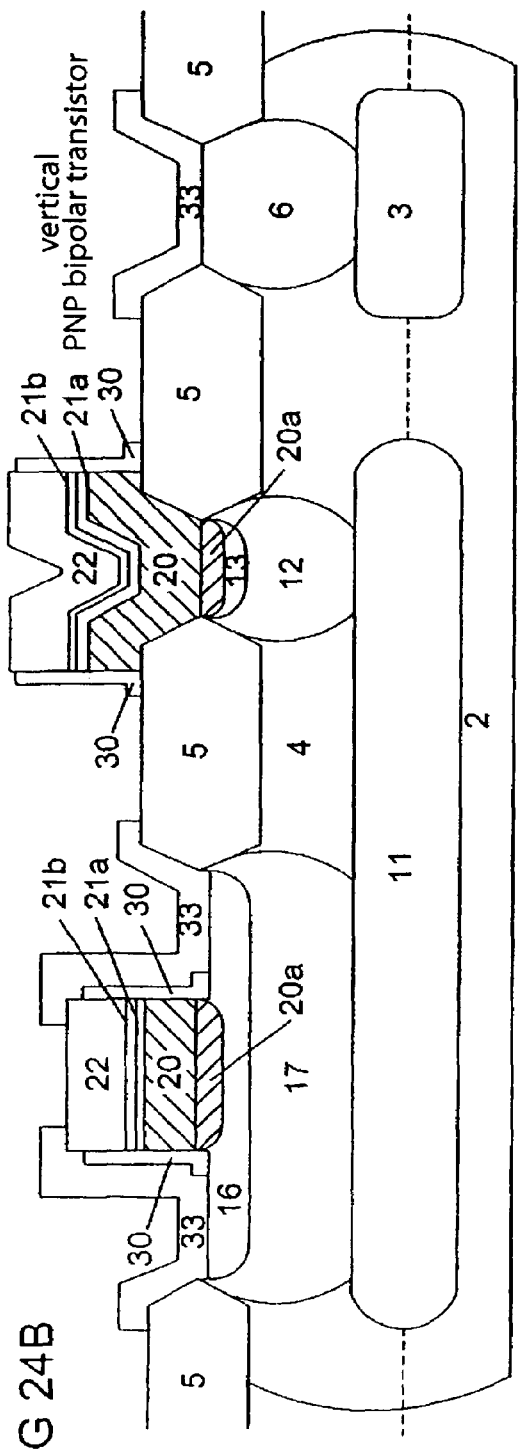

METHOD FOR A PARALLEL PRODUCTION OF AN MOS TRANSISTOR AND A BIPOLAR TRANSISTOR

CROSS-REFERENCE TO RELATED APPLICATION

This application is a continuation of copending International Application No. PCT/EP02/07312, filed Jul. 02, 2002, which designated the United States and was not published in English.

BACKGROUND OF THE INVENTION

1. Field of the Invention

The present invention relates to the field of producing semiconductor devices and particularly to the field of generating several semiconductor devices in parallel.

2. Description of the Prior Art

Generating semiconductor devices in parallel on a substrate is well-known in semiconductor technology. Thus, for example in a BICMOS process, a specific sequence of processor steps is passed to generate CMOS and bipolar transistors on a semiconductor substrate. A possible BICMOS process is described, for example, in Widmann, Mader, Friedrich, "Technologie hochintegrierter Schaltungen", Springer Verlag, 2nd edition, 1996.

While BICMOS processors allow relatively many steps in a parallel processing for the production of CMOS and bipolar transistors with low integration density, for the production process for CMOS and bipolar transistors with high integration densities, currently, methods are used where the process steps for CMOS and bipolar transistors are mainly sequenced successively. For example, during the production of certain parts of the bipolar transistor, the CMOS transistors are covered with one or several layers to limit the effect of the specific process steps merely to the area of the CMOS transistors.

By successivly sequencing bipolar and CMOS process blocks, during the manufacturing process, a stripe with a width of several micrometers of deposited layers builds up between bipolar and CMOS transistors, which prevents a denser packing of bipolar and CMOS transistors.

Further, the CMOS and/or bipolar transistors are subject to a higher thermal stress than in a pure CMOS or bipolar process, since they are additionally subject to the process temperatures of the production steps for generating the other device. Due to the tendency in newly developed bipolar or CMOS transistors towards larger and larger dopant gradients, i.e. to constantly flatter dopant profiles, these transistors react sensitively to the additional thermal stress. Further, a mechanical tension is imparted on the devices covered with one or several layers by the thermal stress, which can lead particularly in the newly developed transistors with a flat profile to a deterioration of the devices in comparison to a production with a pure bipolar or CMOS process.

It is thus desirable to provide a method for a parallel production of devices of different types, which enables producing the devices with a high integration density and where method steps are performed with a high parallelism.

Further, it is desirable to reduce thermal stress and mechanical tension in a parallel production of semiconductor devices of different types.

SUMMARY OF THE INVENTION

It is the object of the present invention to provide an improved method for producing semiconductor devices of different types.

In accordance with a first aspect, the present invention provides a method for parallel production of an MOS transistor in an MOS area of a substrate and a bipolar transistor in a bipolar area of the substrate, comprising: generating an MOS preparation structure in the MOS area, wherein the MOS preparation structure comprises an area provided for a channel, a gate dielectric, a gate electrode layer and a mask layer on the gate electrode layer; generating a bipolar preparation structure in the bipolar area, wherein the bipolar preparation structure comprises a base terminal layer and a mask layer on the base terminal layer; common structuring of the gate electrode layer and the conductive layer by using the mask layers for defining a gate electrode in the MOS area and a base terminal area and/or emitter/collector terminal area in the bipolar area; thinning the mask layer in the area of the gate electrode, so that a thinned mask layer remains in the area of the gate electrode; and doping the conductive layer in the area of the gate electrode across the thinned mask layer.

The generated bipolar transistor can thereby be both a lateral bipolar transistor and a vertical bipolar transistor.

The present invention is based on the knowledge that in producing an MOS transistor and a bipolar transistor in parallel, a high parallelism of production steps is achieved by performing the structuring of the gate electrode of the MOS transistor and a base terminal (NPN transistor) and/or an emitter/collector terminal aera (PNP transistor) of the bipolar transistor simultaneously.

Further, by thinning the mask layer in the area of the gate electrode it is achieved that the mask layer can be used as mask for doping the gate electrode, wherein a further increase of the parallelism of the method can be achieved.

It is an advantage of the present invention that thermal and mechanical stresses of the MOS transistors and the bipolar transistors are reduced.

It is another advantage of the present invention that the MOS transistors and the bipolar transistors can be produced with low area requirements per transistor.

In a preferred embodiment of the present invention, the substrate is prepared such that it has an MOS area and a bipolar area, wherein the MOS area was a first gate electrode layer and a conductive layer deposited on the first gate electrode layer as a second gate electrode layer on a gate dielectric layer, which is deposited on the substrate. Further, after the preparation, the bipolar area of the substrate has a highly conductive layer on the substrate, which has been deposited together with the conductive layer.

A mask layer is continuously deposited onto the conductive and highly conductive layer of the prepared structure. Thereupon, etching is performed via a photoresist mask. The prepared structure has similar layer sequences in the gate area of the MOS area and a base terminal area, which enables a simultaneous structuring of both the structure of the gate electrode and a base terminal area of the bipolar transistor by etching, wherein providing undesired cover layers over the components is avoided. Thereby, the base terminal area is structured such that a window for doping a collector and base area and for depositing an emitter area is generated. Doping the source, drain and gate areas of the MOS transistor is performed after doping the collector and base areas of the bipolar transistor, whereby in the MOS area a penetration of the dopant and the deterioration of the MOS transistor connected therewith is avoided, and the inventive method is suitable for producing temperature sensitive components.

Further, a layer is deposited, which serves both for forming a spacer for defining desired dopant areas of the source and drain areas of the MOS transistor and for isolating the emitter against the base terminal area.

Preferably, by using the inventive method steps, further devices, such as varactor diodes or MOS capacitors, can be generated in the substrate.

Further developments of the present invention are disclosed in the dependent claims.

BRIEF DESCRIPTION OF THE DRAWINGS

These and other objects and features of the present invention will become clear from the following description taken in conjunction with the accompanying drawings, in which:

FIGS. 1 to 26 are schematical cross section views, which illustrate a process sequence of a preferred embodiment of the present invention.

DESCRIPTION OF THE PREFERRED EMBODIMENTS

Figure 2A:
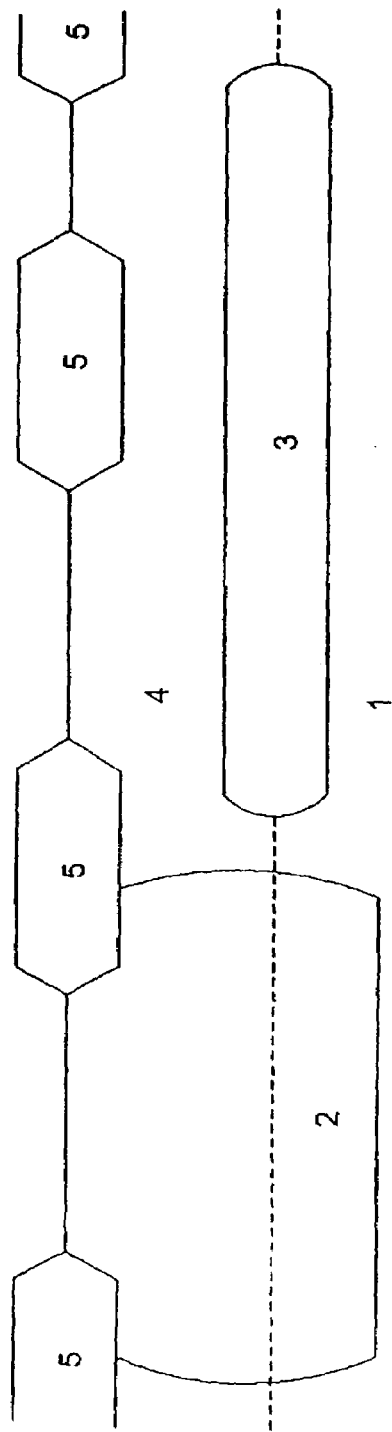

The below-described preferred embodiment of the present invention illustrates a method process for producing an MOS transistor, a PMOS transistor, an NPN bipolar transistor and a vertical PNP transistor in parallel in the substrate.

Further, a MOS capacity and a varactor are generated in parallel in the substrate 1. In the different figures, similar elements and areas in the substrate are referenced with same reference numbers.

In a first processing step, in areas of a weakly p-doped substrate 1, where MOS transistors or vertical PNP transistors are to be generated, a well area 2 with an n-doping is generated. The substrate 1 consists of p-doped silicon with an acceptor concentration of about $10^{15}$ cm$^{-3}$. The well area 2 is generated with a donor concentration of about $5 \times 10^{16}$ cm$^{-3}$ by an implantation and subsequent annealing of the dopant. The diffusion of the dopant can thereby be accelerated by tempering in an $O_2$-containing atmosphere.

Further, a low-impedance n-doped buried layer 3 is generated in the substrate in a depth of about 0.5 μm, which is provided in the finished processed semiconductor as a terminal layer for a lower electrode of an MOS capacity and a cathode of a varactor, for the terminal of a collector of a NPN bipolar transistor and for the base terminal of a lateral PNP bipolar transistor.

In the described embodiment, the buried layer 3 is generated by a near-surface implantation of the dopant and subsequent epitaxial deposition of an epitaxial layer 4 on the substrate 1. Alternatively, in a different embodiment, the buried layer 3 can be produced by implantation of donor ions with an energy of several 100 to 1000 keV and subsequent annealing of the implantation defects.

FIGS. 1a and 1b show areas of the substrate 1 after generating the well 2 and the buried layer 3.

FIG. 1a shows an MOS area and a bipolar area of the substrate, wherein the well 2 is formed with a donor concentration of about $5 \times 10^{16}$ cm$^{-3}$ in the MOS area, and extends from the surface of the epitaxial layer 4 deposited on the substrate 1 with a depth of several micrometers into the substrate 1. Further, an elongated buried layer 3 is formed in the bipolar area, which extends along the interface of the epitaxial layer 4 and the substrate 1 and has no connection to the surface of the epitaxial layer.

While FIG. 1a shows a base structure, where an MOS transistor is generated in the MOS area and an NPN bipolar transistor is generated in the bipolar area, FIG. 1b has a V PNP area, where a vertical PNP bipolar transistor is generated. According to FIG. 1b, a buried layer 3 is formed in a V PNP area, which serves as a ground terminal of the substrate in the V PNP area.

Figure 2B:
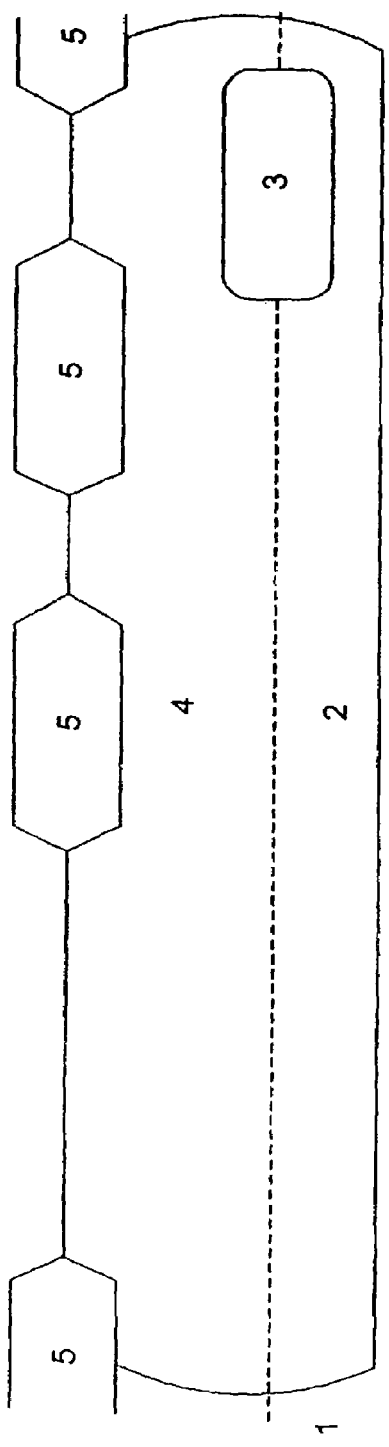

FIG. 2a shows the areas illustrated in FIG. 1a after performing an isolation method. In this isolation method, near-surface isolation areas 5 of silicon dioxide are generated, which ensure an electrical insulation of the devices and the terminals of the devices against each other. For generating the isolation areas 5, preferably, a LOCOS method (LOCOS=local oxidation of silicon method) or a STI method (STI=shallow trench isolation method) is used. FIG. 2b shows the vertical PNP area shown in FIG. 1b, after generating the near-surface isolation areas 5 disposed in the epitaxial layer 4.

Additionally, in one embodiment, the isolation of the devices can be achieved by a trench isolation method, which contributes to achieving a further area reduction.

For the connection of the buried layer 3, a low-impedance n-doped connection well 6 is generated in a subsequent process step. Preferably, generating the connection well 6 is performed by implanting donor ions and subsequently diffusing the dopant.

FIG. 3a shows the MOS area and bipolar area shown in FIG. 2a after generating the low-impedance connection well 6. The connection well 6 extends in an area between two isolation areas 5 from the surface of the epitaxial layer 4 to the buried layer 3.

FIG. 3b shows the area shown in FIG. 2b also after generating the connection well 6, wherein, corresponding to FIG. 3a, the connection well 6 extends in an area between two isolation areas 5 from the surface of the epitaxial layer 4 vertically to the buried layer 3.

Figure 3C:
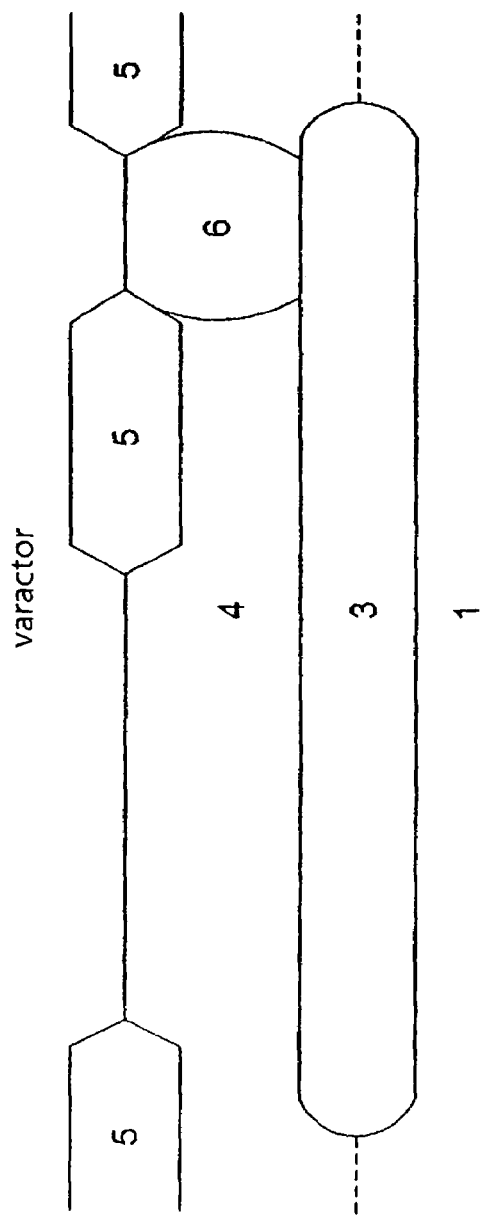
Figure 3D:
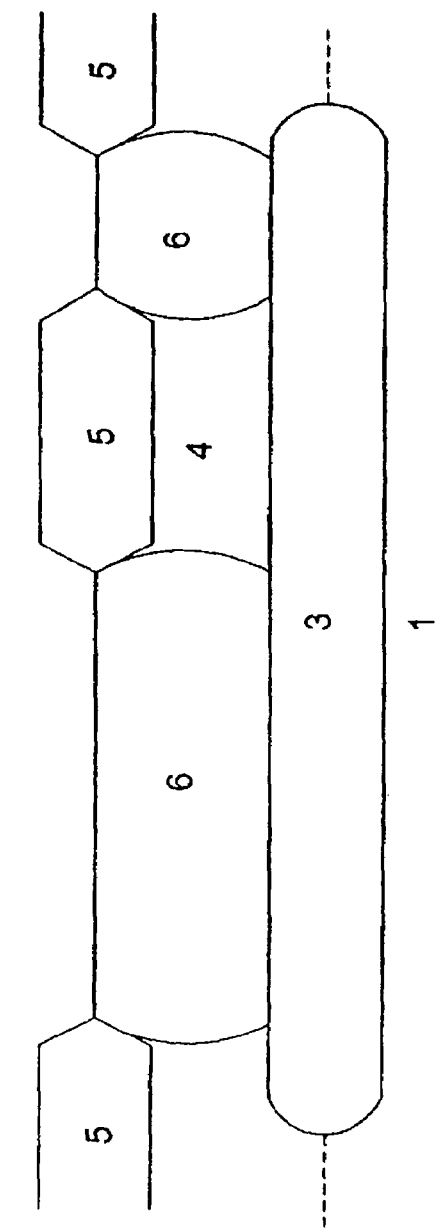

FIG. 3c shows a varactor area and FIG. 3d shows a capacity area after passing through the above-described processing steps. FIG. 3c has the substrate 1 with the epitaxial layer 4 deposited above it as well as an elongated buried layer 3, wherein the elongated buried layer 3 is connected to the connection well 6, to provide an electrical connection to the surface. Further, several isolation areas 5 are formed on the surface of the epitaxial layer 4.

FIG. 3d shows an area for producing an MOS capacity, wherein an elongated buried layer 3 is connected via two connection wells 6 to surface areas of the epitaxial layer, which are isolated by the isolating areas 5.

Figure 4:
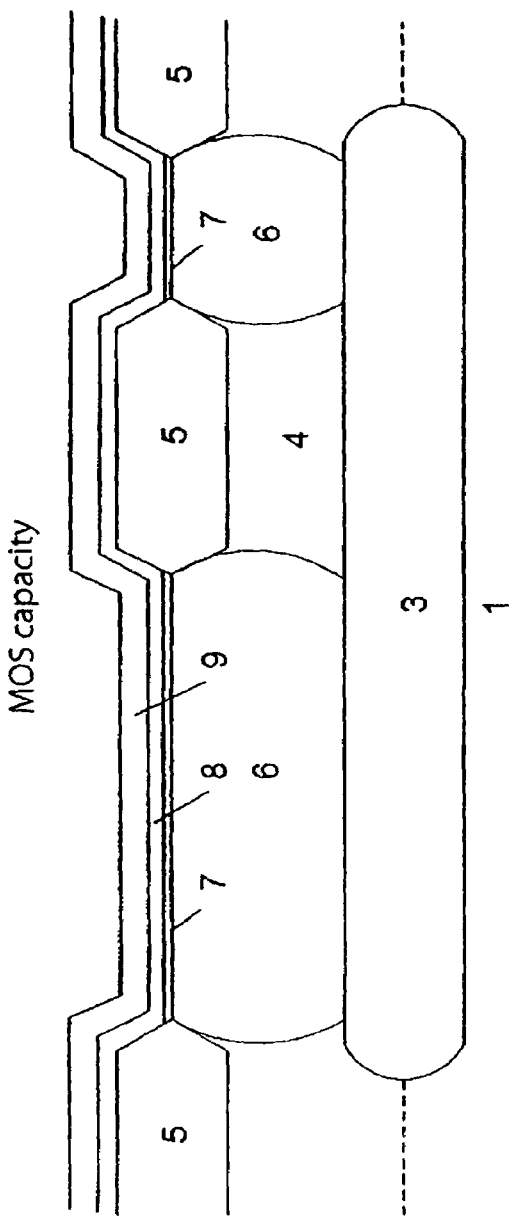

FIG. 4 shows the capacity area after generating an oxide layer 7 and a nitride layer 8 in the area of the connection wells 6, wherein the oxide layer 7 and the nitride layer 8 serve as a dielectric layer for the MOS capacity. First, the oxide layer 7 is formed of a thermal oxide on the whole surface of the epitaxial layer 4 as a thin layer with a thickness of a few nm. Above that, a thin nitride layer 8 with a thickness of a few 10 nm is deposited, wherein the nitride layer 8 extends continuously. Also, a conductive layer 9 is deposited preferably as polysilicon layer continuously on the nitride layer 8 and etched selectively to the nitride disposed below, in a subsequent structuring process via a photoresist mask 10 and an RIE etching step (RIE=reactive ion etch), so that the conductive layer 10 extends on the area of the connection well 6 and partly on part of the isolation areas bordering on the connection well 6, see FIG. 5. The conductive layer 9 acts as a protective layer for the oxide layer 7 and the nitride layer 8 during the subsequent processing steps. The conductive layer 9 can be generated doped in such a way that the same serves as upper electrode of the MOS capacity.

Figure 5:
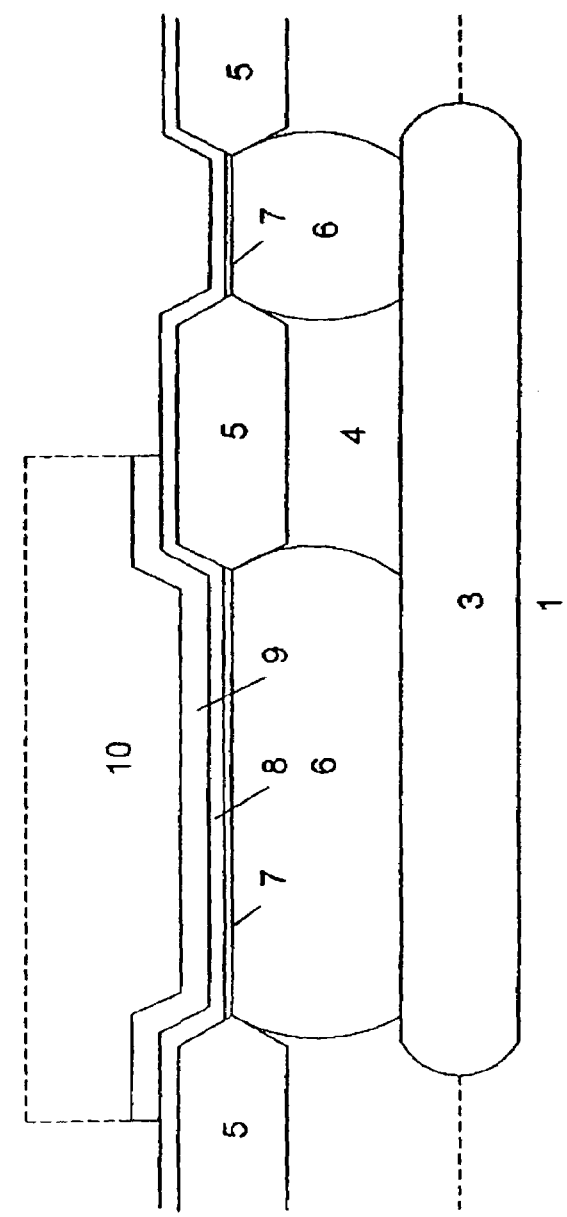
Figure 6:
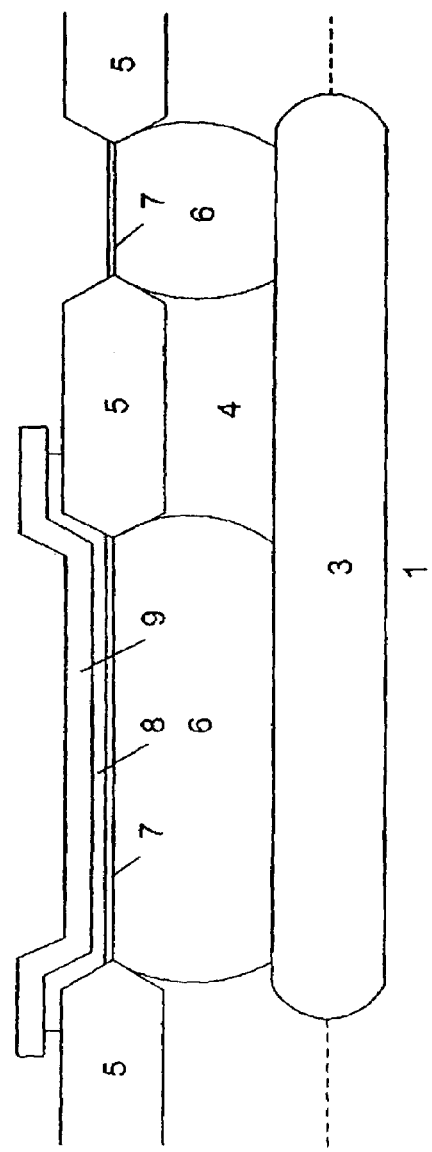

FIG. 6 shows the structure shown in FIG. 5 after a further step of etching the nitride layer 8 selectively to the oxide and the conductive layer of the layers 7 and 9 and the subsequent removing of the photoresist mask 10. The oxide of the oxide layer 7 remaining on the surface of the epitaxial layer serves as a stray layer for subsequent implantation in the production process, for suppressing channeling of the dopant in the substrate as well as an out diffusion of the implanted dopant into the environment. In the described embodiment, the conductive layer 9 has a thickness of about 100 nm and is formed of polysilicon, which is doped at later time.

The dielectric of the MOS capacity, i.e. the oxide layer 7 and the nitride layer 8 can alternatively be deposited after forming the gate dielectric and the gate electrode and structured thereupon, wherein the MOS dielectric is also deposited on the gate electrode. In this case, it is not necessary to form the electrically conductive layer 9, since the upper gate electrode is subsequently deposited. After the oxide layer 7 and the nitride layer are deposited, the nitride layer 8 is etched, selectively to the oxide of the oxide layer 7 lying below, in an RIE step with a photo mask.

Figure 7A:
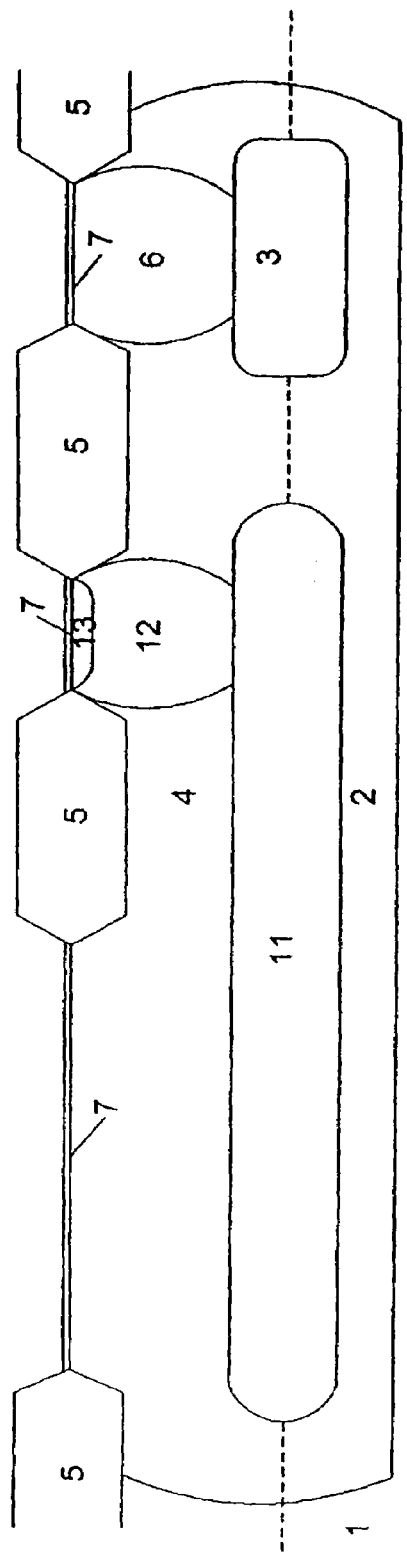

Thereupon, for forming a collector terminal for a vertical PNP bipolar transistor, a low-impedance, p-conductive buried terminal layer 11, which is in a depth of about 0.5 μm, is generated, for example by an implantation of acceptor ions with an energy of several 100 keV, see FIG. 7a. Also, buried terminal layers 11 are generated in the NMOS areas, see FIG. 7b, which have a p-doping. The buried layer 3 serves as terminal layer for the PMOS transistor.

In a next step, a collector terminal for the V PNP transistor and a doped well and a conductive channel for the MOS transistor are formed simultaneously. Therefore, both in the V PNP area and in the MOS area, wells 12, which extend about 0.5 μm deep into the substrate from the surface, are generated by a near-surface implantation of acceptor and donor ions, respectively. Further, near the surface of the formed well 12, p-conductive and n-conductive layers 13, respectively, are generated by a further near-surface implantation. Alternatively, in the area of the conductive layer 13, which is provided for forming the channel of the MOS transistor, a doping for generating the conductive channel can also be performed in a later process step.

In the V PNP area, the conductive layer 13 serves to improve the electrical connection of the well 12 to the surface and the layers subsequently deposited on the surface, respectively, while the conductive layer 13 is used as channel layer in the MOS area. Implantation damages, which occur during the implantation, are annealed with a temper step. Selectively, the subsequent step for gate oxidation, which will be described below, can be used as temper step.

FIG. 7a shows the V PNP area after the above-described method steps. The p-doped terminal layer 11 extends as elongated layer along the interface between substrate 1 and epitaxial layer 4, while the conductive layer 13 is formed on the surface of an area between two isolation areas 5, from where the well 12 extends vertically to the terminal layer 11, to connect the buried terminal layer 11 to the surface.

FIG. 7b shows the MOS area and the bipolar area after forming the above-mentioned process steps. As in the V PNP transistor, the buried layer 11 is connected to the surface via the well 12 in an area between two isolation areas 5. The conductive layer 13, which is formed on the well 12, is thereby the p doped channel layer of the NMOS-transistor.

As has already been mentioned, the oxide layer 7 deposited on the surface serves as a stray layer during the implantation of acceptor and donor ions, respectively, of the well 12 and the conductive layer 13. The dopant concentration of the conductive layer 13 determines the starting voltage of the MOS transistor.

Thereupon, the thin oxide layer 7, which served as stray layer for the implantations and as cover for subsequent temper steps, is removed.

Subsequently, a first dielectric layer 14, which has a thickness of several nm and consists of a thermal oxide, as well as a first gate electrode 15, which consists of undoped polysilicon with a thickness of 100 nm, are deposited on the surface. The first gate electrode layer 15 will then be selectively removed to the oxide of the gate dielectric layer 14, in an RIE step with a photoresist mask in areas of the substrate surface, where no MOS transistors are formed.

FIG. 8 shows the MOS area and the bipolar area after performing the previously mentioned processing steps. On the conductive layer 13, the MOS area has the thin dielectric layer 14 and the first gate electrode layer 15. The bipolar area has the gate dielectric layer 14 on the surface of the epitaxial layer 4.

In a subsequent step, a base area 16 and a collector area 17 of the V PNP transistor and a well 18 are generated in the varactor area. Thereby, an implantation of acceptors and donors, respectively, through the dielectric layer 14 is performed via a photoresist mask. In a subsequent tempering, the implantation defects are annealed and a desired dopant distribution is ensured.

FIG. 9 shows the V PNP area after performing the above-mentioned process step. The p doped collector area 17 is formed over the p doped terminal layer 11 in a well profile. Further, the n doped base area 16 is formed between the collector areas 17 and the gate dielectric layer 16.

FIG. 10 shows the varactor area after forming the above-mentioned process steps. The formed n-doped well 18 extends from the gate dielectric layer 14 to the buried layer 3 in a vertical direction.

As a subsequent step, the gate dielectric layer 14 is removed in the areas outside the MOS transistor, selectively to the silicon substrate, for example via wet-chemical etching. Thereupon, an electrically conductive layer 19 is deposited, which serves in the bipolar area as base terminal of the NPN transistor, in the MOS area as upper gate electrode, in the V PNP area as emitter and collector terminal, in the capacity area as upper electrode of the MOS capacity and in the varactor area as upper electrode.

In the described embodiment, the conductive layer 19 has a silicon layer with a thickness of about 200 nm, which is deposited as amorphous layer. The conductivity of the conductive layer 19 is achieved by a subsequent dopant implantation and subsequent annealing steps. Thereby, in the areas with a contact of the conductive layer 19 to the epitaxial layer 4, a dopant profile is generated therein, which has a depth of merely several 10 nm.

In the bipolar area, and in areas which are provided for a low impedance resistance, the conductive layer 19 is additionally highly p-doped, to obtain a highly conductive layer 20. The generation of the highly conductive layer 20 of the conductive layer 19 is performed for example, by using a photoresist mask in connection with a subsequent implantation of acceptor ions. A high-impedance resistance can consist of the conductive layer 19 with conductive areas of the highly conductive layer 20 for the terminals.

Figure 11:
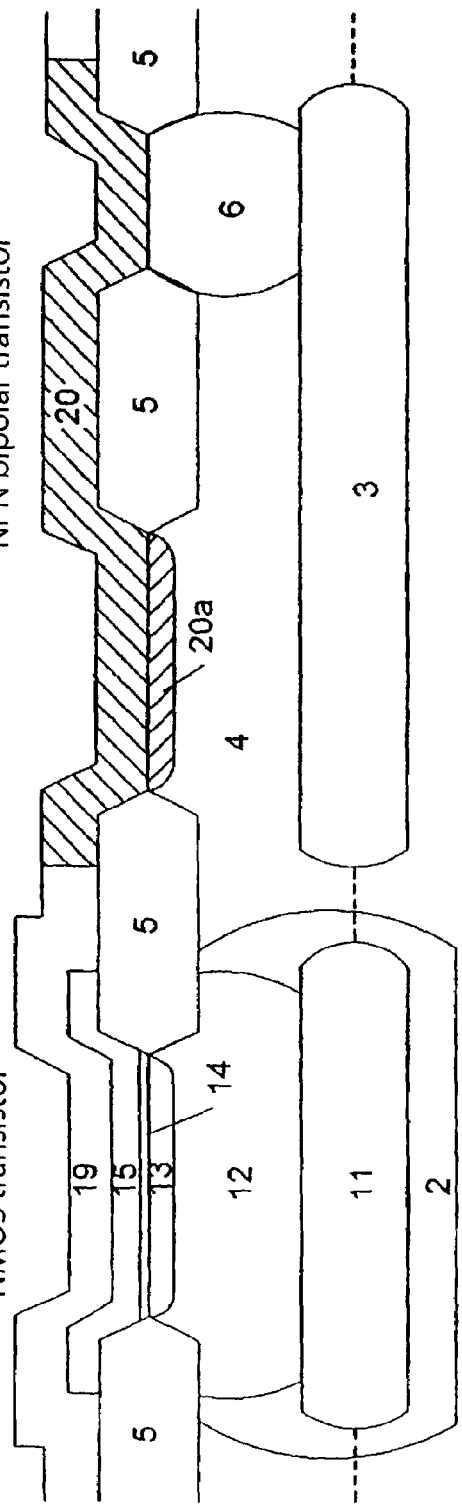

FIG. 11 shows the MOS area and the bipolar area in the state after performing the above-described production steps.

Thereby, the MOS area has the conductive layer 19 on top of the first gate electrode layer 15, while the highly conductive layer 20 is disposed oh the surface in the bipolar area. The dopant of the highly conductive layer 20 is distributed in a vertical direction during subsequent processing steps, by the occurring high thermal stress of subsequent temper steps and layer depositions and incorporated in the silicon grid, so that the dopant is electrically active there. Further, FIG. 11 shows the p-conductive area 20a on top of the epitaxial layer 4 originating from the diffusion of the dopant from the area of the highly conductive layer 20. In the area of the connection well 6, however, no p conductive area is formed, since in this area, the donor concentration is higher than the acceptor concentration resulting from the diffusion from the highly conductive layer 20. The diffusion from the highly conductive layer 20 only takes place until the same is removed in the area of the connection well.

To minimize a further diffusion of the acceptor ions of the diffusion layer 20a into the epitaxial layer 4 and the silicon substrate 1, respectively, the doping of the highly conductive layer 20 can alternatively be performed after forming a first isolation layer 21a, which will be described below.

As next step, at least one isolation layer, which also serves as mask layer, is deposited. In the preferred embodiment, an isolation layer sequence, which can also be referred to as mask layer sequence, is formed of a first isolation layer, which comprises a TEOS isolation layer 21a deposited from a tetraethyl orthosilicate (TEOS) and a nitride isolation layer 21b of nitride material, and a second TEOS isolation layer 22. In an alternative embodiment, the isolation layer 21 can be formed of a single layer. The TEOS isolation layer 21a and the nitride isolation layer 21b have a thickness of about 20 nm, respectively, while the second isolation layer 22 has a thickness of about 200 nm. The isolation layer and the isolation layer sequence, respectively, serve in the bipolar area to electrically isolate the highly conductive layer 20, which represents a base terminal, and a still to be deposited emitter terminal layer 33, which consists of polysilicon with a high n-doping. In the MOS area, the isolation layer sequence serves as a hard mask for a subsequent anisotropic etching of the gate silicon, which is formed by the first gate electrode layer 15 and the conductive layer 19, and further as a diffusion barrier for a subsequent tempering after doping the gate silicon.

Figure 12:
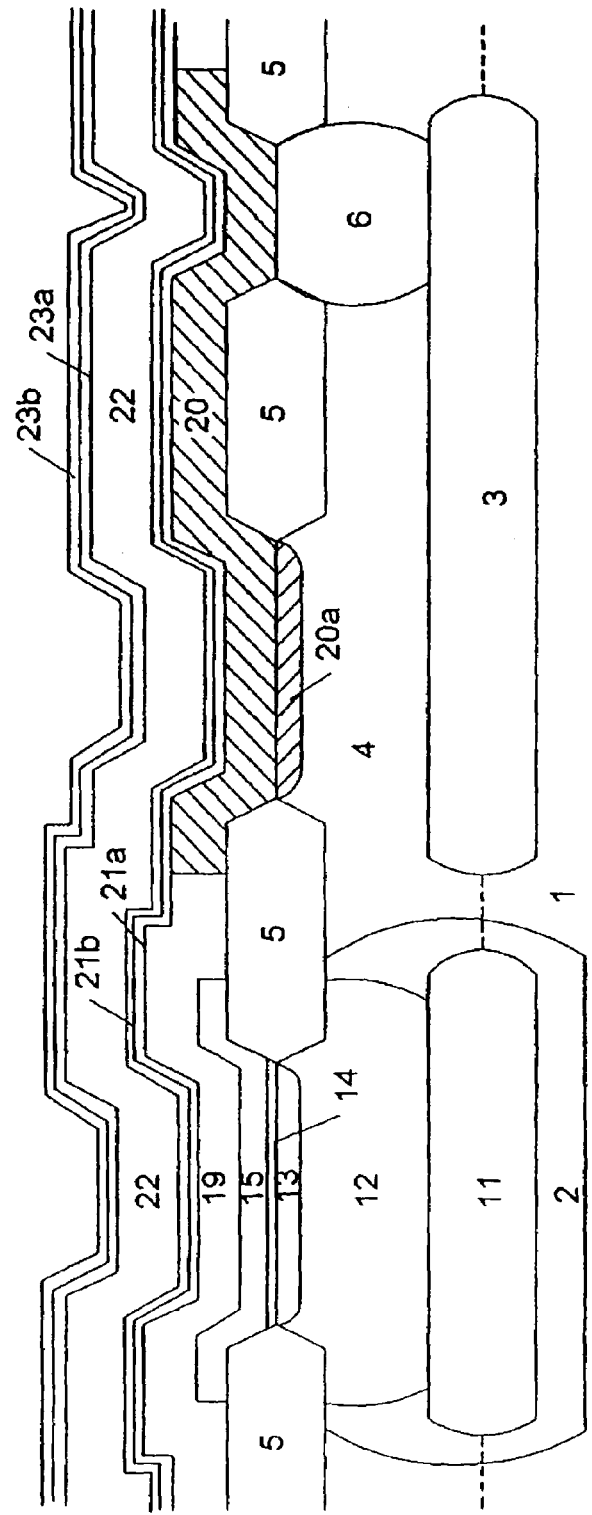
Figure 13:
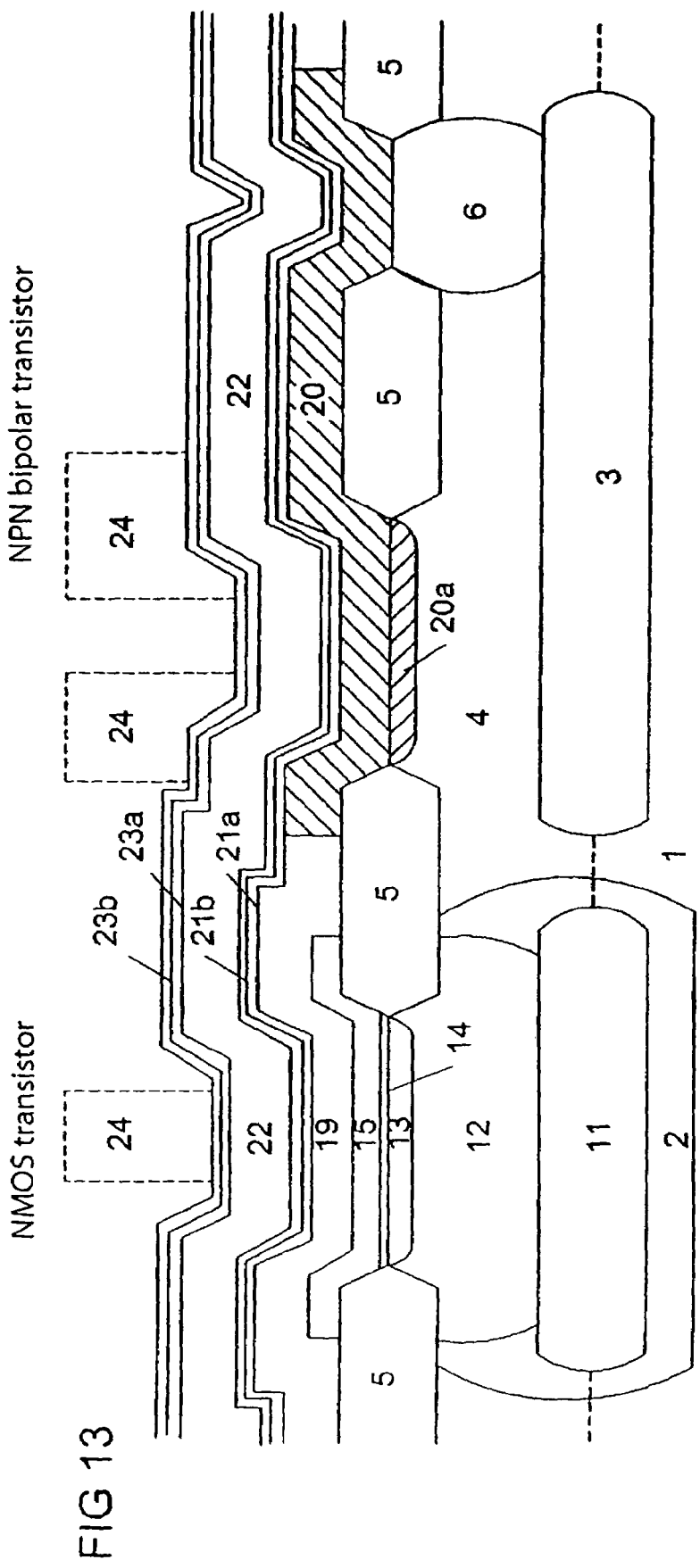

FIG. 12 shows the MOS area and the bipolar area after depositing the isolation layer sequence. Thereby, the TEOS isolation layer 21a is disposed continuously on the conductive layer 19 and the highly conductive layer 20, respectively. Further, in FIG. 12, the nitride isolation layer 21b deposited on the TEOS isolation layer 21a and the above disposed second isolation layer 22 are shown.

The usage and function of the isolation layer sequence will be explained below.

The isolation layer sequence, which consist in the described embodiment of the isolation layers 21a, 21b and 22, has to be deposited with a thickness of about 200 nm in the above-described step, since it will be used in the bipolar area to ensure a good isolation between the highly conductive layer 20 and a later deposited emitter layer 33, and to avoid a spurious parasitic capacity, which results from the highly conductive layer 20, the isolation layer sequence and the emitter layer 33, and further to enable a sufficiently high etching edge when generating a spacer, as will be described below.

The second isolation layer 22 is etched in the MOS area in a subsequent step via wet-chemical or dry etching, so that a respective thinness of the isolation layer is achieved in the gate area, which makes it possible to perform a high p- and n-doping of the gate electrode by a near-surface implantation, respectively. Thereby, a near-surface ion implantation has to be used for the gate doping, since, a doping of the silicon substrate lying below has to be avoided in the gate area and the near-surface source and drain areas in the conductive layer 13 are to be doped simultaneously with the gate electrode. Therefore, a thickness of the isolation layer of several 10 nm is required in the gate area.

In order to achieve this thinning of the isolation layer in a controlled manner, an isolation layer sequence of the first isolation layer 21a, 21b and the second isolation layer 22 is used in this embodiment, wherein the second isolation layer 22 with a thickness of about 200 nm can be etched selectively to the lying below first isolation layer.

In the described embodiment, the first isolation layer comprises two layers, i.e. the TEOS isolation layer 21a and the nitride isolation layer 21b, wherein the reason for using the layers will be explained below.

Prior to doping the gate electrode, an etching is performed in the area of the gate electrode for structuring the gate electrode, wherein the first isolation layer remaining after the etching of the second isolation layer is used on top of the gate electrode as a hard mask, to avoid etching of the gate electrode. If a single first isolation layer is used, the layer has to fulfill the requirements of an etch stop for etching the second isolation layer 22 and a hard mask for structure etching the gate electrode. If no appropriate material is available for the first isolation layer, the first isolation layer can consist of several layers, for example, according to the described embodiment, of the TEOS isolation layer 21a and the nitride isolation layer 21b. Thereby, the nitride isolation layer 21b fulfills the requirement of an etch stop for etching the second isolation layer 22, while the TEOS isolation layer 21a represents an etch stop and thus a hard mask for the structure etching of the gate electrode, where the nitride isolation layer 21b is removed.

Alternatively, instead of an isolation layer sequence, a single isolation layer can be used as mask layer, wherein its thinning is performed by an anisotropic RIE etching step with fixed etching time.

The usage of several isolation layers with different materials as mask layer has the advantage of a higher controllability, since selective etching can be achieved by an appropriate material choice, so that during wet-chemical etching or dry etching, a layer lying below acts as etch stop, whereby generating layers with a defined layer thickness becomes possible.

Further, an ARC layer (ARC=antireflective coating layer) is shown on the second isolation layer 22, which consists of a silicon layer of amorphous silicon with a thickness of about 40 nm, and a silicon nitride layer 23b with a thickness of about 35 nm. The ARC layer is preferably formed by sputtering and serves to improve the structuring of a subsequently generated gate electrode structure and a window area in the highly conductive layer 20 of the bipolar area. For structuring the gate electrode, a window area in the bipolar area and an emitter/collector terminal area in the V PNP area, a photoresist is deposited and exposed. The formed photoresist structure 24 has a recess in the bipolar area, which defines the area for forming a window in the highly conductive layer 20. Thereupon, the ARC layer 23a and 23b, the second isolation layer 22, the nitride isolation layer 21b and the TEOS isolation layer 21a are removed in an anisotropic RIE etching step in those areas, which are not covered by the photoresist 24, to structure the gate electrode, the window in the bipolar area and the emitter/collector terminal area in the V PNP area. For removing, several RIE steps can be used, wherein the last step is selectively to the polysilicon material of the conductive layer 19 and the highly conductive layer 20, respectively.

FIG. 14 shows the MOS area and the bipolar area after etching the isolation layers 21a, 21b and 22 and the ARC layer 23a and 23b. Thereby, the area, where the gate electrode is to be formed, comprises the isolation layer structured by photolithography with the layers 21a, 21b, 22 on top of the conductive layer 19, as well as the ARC layers 23a and 23b disposed thereon. On the ARC layer 23b, further, a ridge of the photoresist 24 is shown, which served as a mask during etching. In the bipolar area, further, a recess is formed in the layers 21a, 21b, 22, 23a and 23b deposited on top of one another, by RIE etching and the mask formed by the photoresist 24. In a subsequent step, the photoresist 24 and polymers, which are formed by etching, are removed.

In a further anisotropic RIE step, remains of the isolation layers 21a, 21b and 22 at topography steps and the silicon nitride of the ARC layer 23b are removed by etching oxides and nitrides selectively with respect to polysilicon.

The method state after performing the etching steps is shown in FIG. 15 for the MOS area and the bipolar area.

Afterwards, thinning of the conductive layer 19 in the MOS area is performed via anisotropic etching. To limit the etching merely to the conductive layer 19 in the MOS area, a photoresist mask 25 is deposited in the bipolar area as protective mask. Simultaneously to thinning the conductive layer 19, the amorphous silicon of the remaining ARC layer 23a is removed, whereby the second isolation layer 22 is exposed.

The thinning of the conductive layer 19 is required to enable a subsequent etching of the conductive layer 19 and the first gate electrode layer 15 together with etching the highly conductive layer 20 without residual remains at the topography steps. After performing the thinning, the remaining thickness of the thinned conductive layer 19 is about 150 nm.

FIG. 16 shows the structure of FIG. 15 after performing the thinning of the conductive layer 19. Further, the surface of the structured second isolation layer 22 is exposed by removing the ARC layer 23a. In the bipolar area, further, the photoresist 25 is shown as a protective mask disposed continuously.

In a subsequent method step, the second isolation layer 22 in the MOS area is removed, wherein the photoresist 25 in the bipolar area ensures that the etching is merely limited to the MOS area.

FIG. 17 shows the MOS area and the bipolar area after removing the second isolation layer 22 in the MOS area.

As has already been explained with reference to FIG. 12, removing the second isolation layer 22 is performed to provide a thin layer of several 10 nm for the subsequent doping of the gate electrode via a near-surface ion implantation in the gate area, which avoids that the dopant gets stuck in the isolation layers.

The simultaneous doping of the gate, source and drain areas provides an additional saving of production steps and increases the parallelism of the method.

In the described embodiment, the isolation layer sequence is formed of the first isolation layer, which comprises the nitride isolation layer 21b and the TEOS isolation layer 21a, and the second isolation layer 22. The first isolation layer fulfills the function of a stop layer for etching the second isolation layer. In the following structuring etching, the nitride isolation layer 21b is etched, so that after structuring the gate electrode, the TEOS isolation layer 21a remains on the same. Further, the TEOS isolation layer 21a is chosen with regard to a layer thickness, which is 20 nm in the described embodiment, such that it has the required thinness for doping the gate electrode through a near-surface ion implantation.

As has already been mentioned above, alternatively, only a single isolation layer can be used as mask layer, wherein its thinning is performed by an anisotropic RIE etching step with a fixed etching time.

In the described embodiment, for structure etching the conductive layer 19 and the highly conductive layer 20, the photoresist 25 is removed. Thereupon, the etching of the conductive layer 19 and the highly conductive layer 20 is performed, which effects a structuring of the gate electrode and the window in the bipolar area.

Thereby, the TEOS isolation layer 21a and the nitride isolation layer 21b remaining in the gate electrode area act as a hard mask, which avoids ablating the conductive layer 19 in the gate area. In this etching, the nitride isolation layer 21b is ablated, so that merely the TEOS isolation layer 21a with a thickness of about 20 nm remains, see FIG. 18a.

In the other area of the MOS area, which is not covered by an isolation layer during etching, the conductive layer 19 and the first gate electrode layer 15 are removed by etching, wherein the etching stops on the gate dielectric layer 14 and the isolation areas 5, respectively. Further, in the bipolar area, the highly conductive layer 20 and the diffusion layer 20a are removed, wherein the overetching is kept very low, since no etch stop is present in the bipolar area by the epitaxial layer 4 lying below. By thinning the conductive layer 19 in a previous step, it is achieved that despite an overetching, which is kept low, the gate electrode structure is structured in the MOS area without remains of topography steps.

Consequently, three functions are fulfilled with the above-described etching step.

First, an etching of the conductive layer 19 in the area of the gate electrode is avoided by the TEOS isolation layer 21a, and the isolation layer is reduced to the thickness of about 10 nm required for the subsequent ion implantation of the gate electrode.

Further, the gate electrode is structured, as is illustrated in FIG. 18a.

The third aspect comprises structuring a window area as recess in the highly conductive layer 20, which represents a base terminal layer for the vertical NPN bioplar transistor. In a later doping, the formed window area serves as doping window for forming the base and collector area.

The inventive simultaneous structuring of the window area and the gate electrode saves respective structuring steps, such as additional photolithography steps and etching steps, and provides a high measure of parallelism for the method.

Figure 18B:
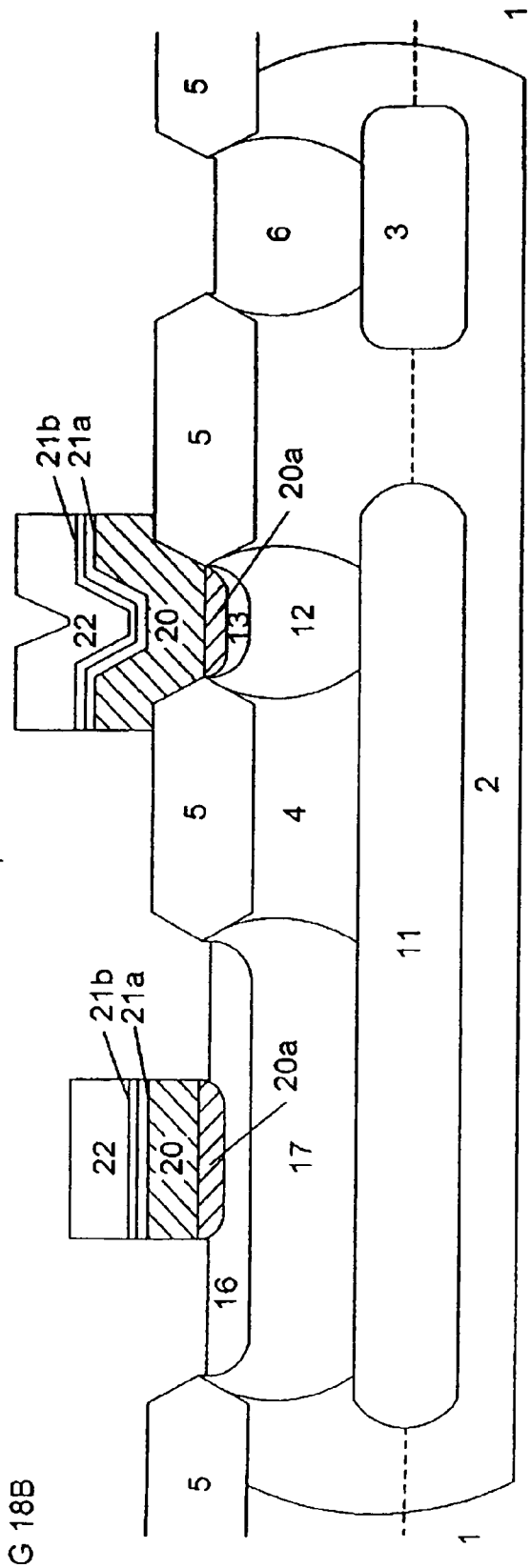

FIG. 18b shows the V PNP area after performing the above-described production steps. A diffusion layer 20a, which is formed by diffusion of acceptor ions from an above disposed highly conductive layer 20 in the base area 16, is formed in the medium area of the base area 16. The TEOS isolation layer 21a, the nitride isolation layer 21b and the second isolation layer 22 are disposed on top of the highly conductive layer 20. Further, in the area of the collector terminal near the surface of the conductive layer 13, a further diffusion layer 21a is formed, whereon again the highly conductive layer 20, the TEOS isolation layer 21a, the nitride isolation layer 21b and the second isolation layer 22 are disposed. The diffusion layer 20a improves the ohmic contact of the highly conductive layer 20 to the conductive layer 13.

Through the above-described steps for structuring the gate electrode of the MOS transistor and for structuring the base terminal layer 20, further, the emitter terminal area and the collector terminal area of the vertical PNP transistor are structured.

Figure 18C:
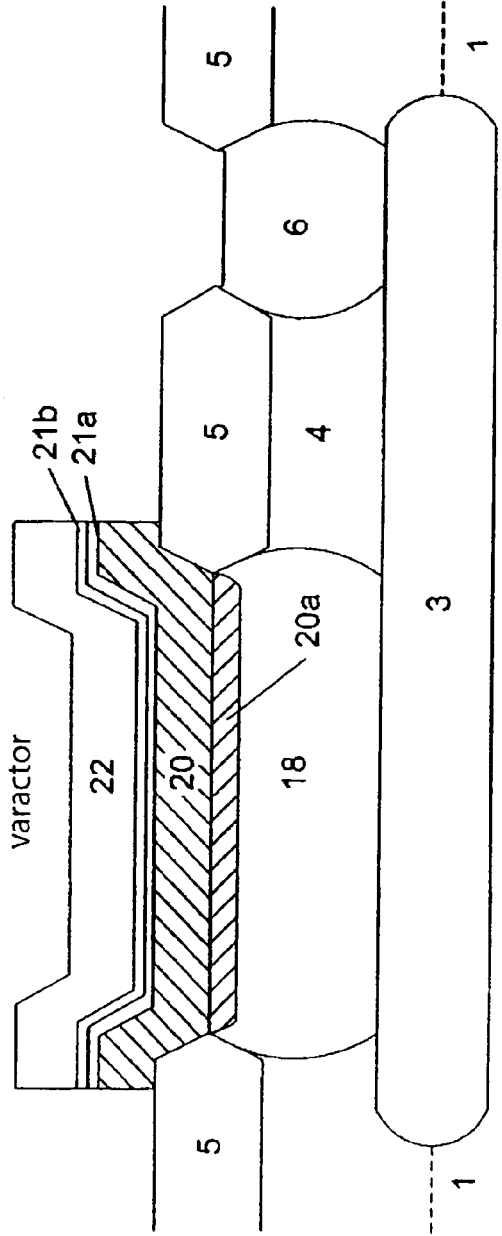

FIG. 18c shows the varactor area in the method state, which corresponds to FIG. 18a and 18b. In the near-surface area of the well 18, the diffusion layer 20a is formed, whereon the highly conductive layer 20, the TEOS isolation layer 21a, the nitride isolation layer 21b and the second isolation layer 22 are disposed, wherein they extend across the area of the well 18 and into the areas of isolation areas 5.

Figure 18D:
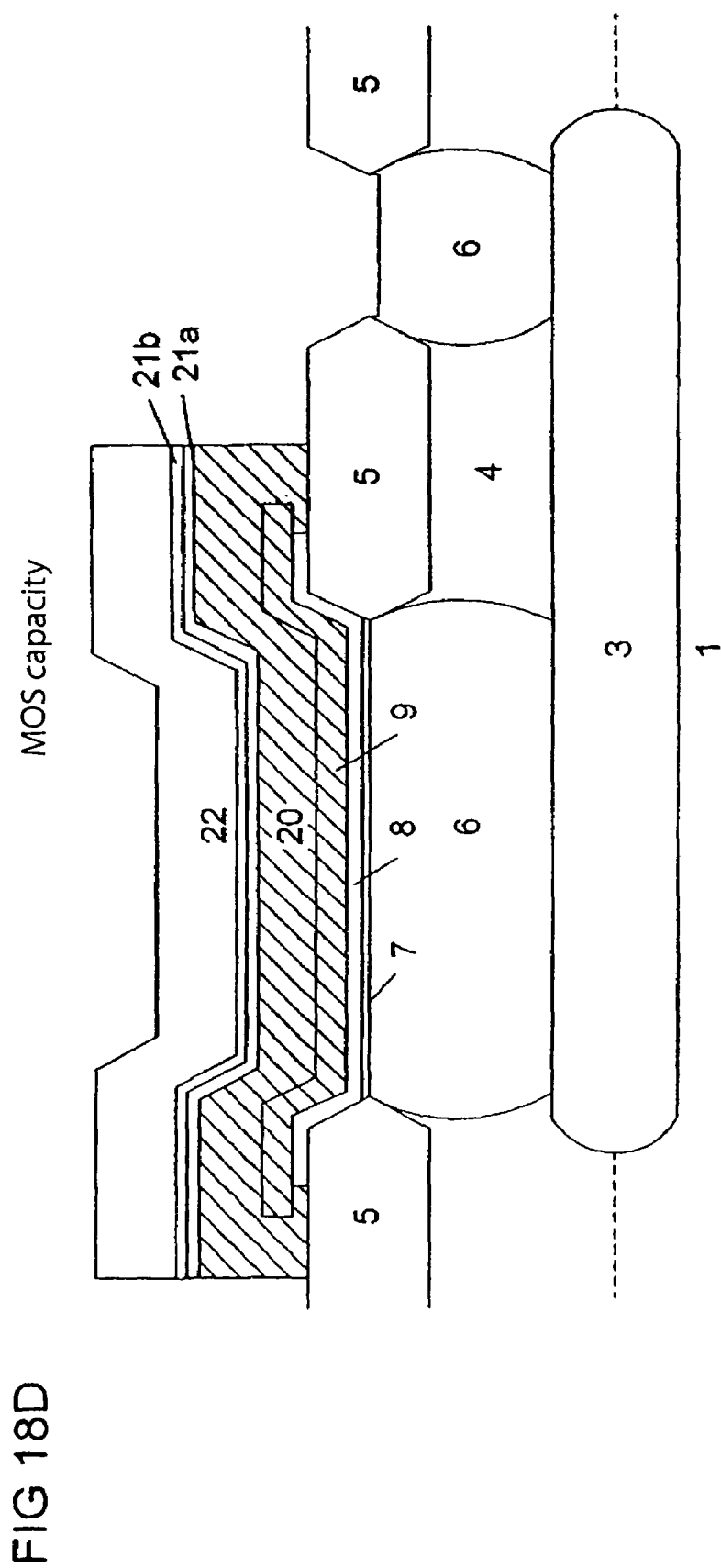

Further, FIG. 18d shows the capacity area in the method state, which corresponds to FIG. 18a–c. The highly conductive layer 20, the TEOS isolation layer 21a, the nitride isolation layer 21b and the second isolation layer 22 are disposed on top of the conductive layer 9, wherein they extend into areas of the adjacent isolating areas 5 across the area of the connection well 6. The conductive layer 9 is doped by the thermal stress of previous temperings and layer depositions by dopant diffusion from the highly conductive layer 20.

In a next production step, a thin isolation layer 26, which can, for example, be formed of a thermal oxide, is deposited. The thin isolation layer 26 fulfills several functions simultaneously, by suppressing a so-called channeling of the dopant in the epitaxial layer 4 during the implantation during the following implantation and further avoids a diffusion of the implanted dopant from epitaxial layer 4 in a subsequent tempering.

Above that, the isolation layer 26, which extends across the surface areas and the side wall areas of the formed structures, acts as an isolation layer for the gate area of the MOS transistors, which surrounds the gate area, so that merely low leakage currents are admitted at the interface of the gate electrode 15 to the gate dielectric.

Thus, the thin isolation layer 26 represents an isolation layer, which is deposited afterwards, which is also referred to as a post oxide. Further, the thin oxide layer 26 and the gate dielectric layer serves as stop layer for the following anisotropic etching of a layer 33 with high n doping in the CMOS area.

Figure 19:
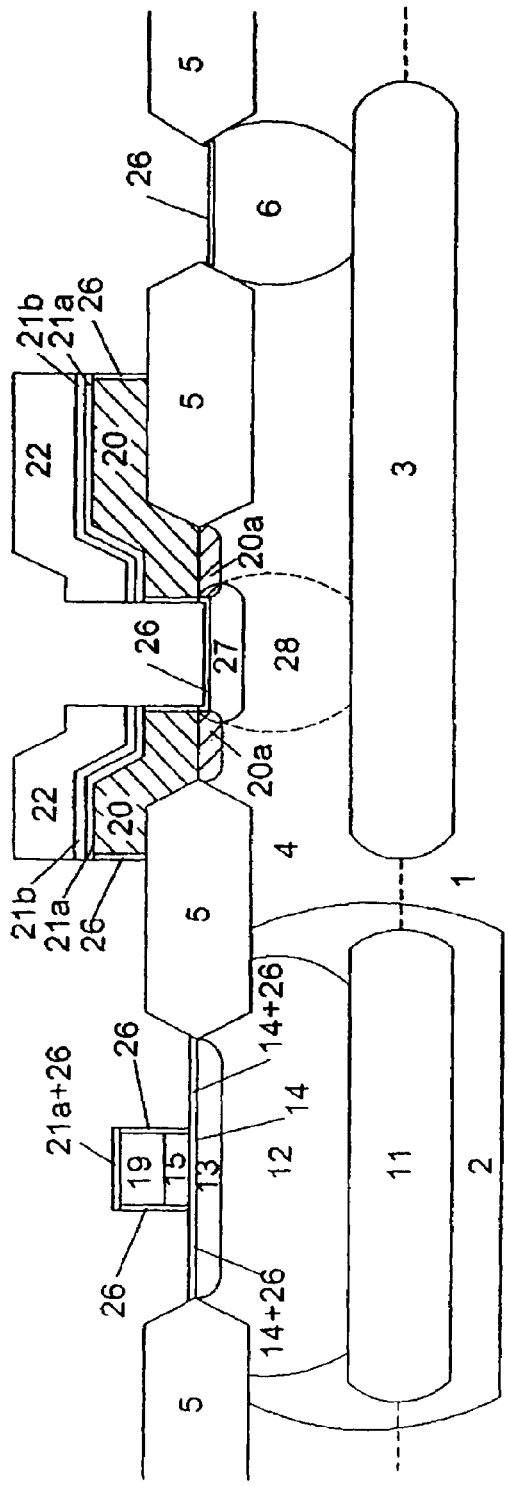

In a following step, the NPN base area 27 and the NPN collector area 28 are generated. The respective dopants are implanted across the thin isolation layer 26, which is disposed in the window of the bipolar area directly on the epitaxial layer 4, and the implantation damages are annealed by tempering. FIG. 19 shows the collector area 28 as a well-shaped area, which is connected to the buried layer 3. Further, between the NPN collector area 28 and the thin isolation layer 26, the p-doped NPN base area is formed in the area of the window of the bipolar area.

In a next method step, the thin isolation layer 26 is removed in the bipolar area, since an emitter area is formed in the area of the window in the bipolar area, which requires direct contact to the NPN base area 27.

In a further alternative embodiment, the thin isolation layer 26 is removed both in the bipolar area as well as in the MOS area.

The thin isolation layer 26 remaining in the MOS area in the described embodiment, serves in the following dopant implantation as a stray layer for the gate electrode and the source and drain area. Above that, the thin isolation layer 26 serves as stop layer in the MOS area for etchings still to follow.

Thereupon, in a first doping step, LDD areas (lightly doped drain areas) are generated for the MOS transistors by an implantation and a subsequent tempering.

Figure 20:
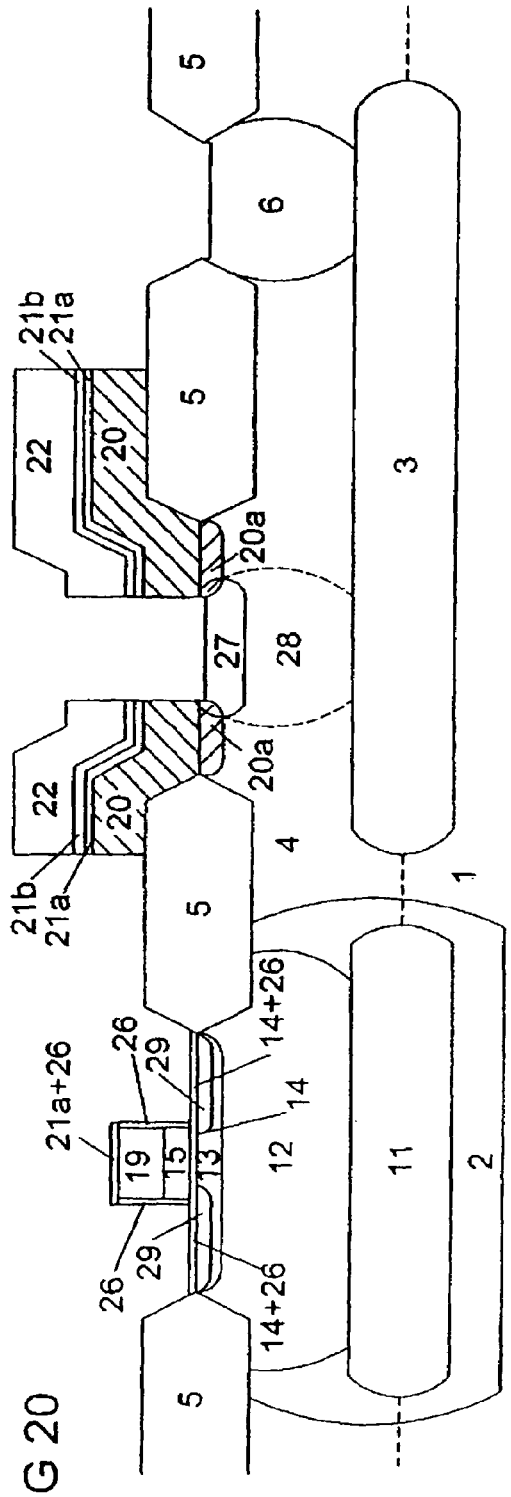

FIG. 20 shows the LDD areas 29 of the source and drain area, respectively, of the MOS transistor in the MOS area, which extend close to the surface below the gate dielectric layer and are spaced apart, to enable the formation of an inversion channel in the conductive layer 13 in an area below the formed gate electrode. In the case, that apart from the described MOS transistor an PMOS transistor is produced as well, the dopant is implanted for the p doped LDD areas of the PMOS transistor.

Afterwards, a spacing layer, which comprises at least one layer, is deposited continuously. It covers the side walls formed during the production process, which comprise the side walls of the gate electrode, the window in the bipolar area and the emitter terminal of the V PNP transistor.

In the described embodiment, the spacing layer comprises a first spacing layer 30 and a second spacing layer 31, as is shown in FIG. 21.

The total thickness of the isolation layer and the isolation layers, respectively, serving as a spacing layer, is chosen such that a spacer formed subsequently from the layers is laterally removed so far from the LDD areas in the MOS area, that in a subsequent dopant step, the source/drain areas 32, and in the subsequent diffusion steps, the LDD areas 29 will not be covered.

Thereby, the source/drain areas 32 represent HDD areas (highly doped drain areas), wherein the usage of LDD areas and HDD areas avoids so-called hot electron effects, which can lead to a decrease of the saturation drain current.

Further, the thickness of the isolation layers serving as spacing layer in the bipolar area is chosen such that the still to be formed emitter and the base terminals of the NPN transistor are far enough away to avoid a diode leakage current between the two areas. In the embodiment, the first spacing layer 30 and the second spacing layer 31 are deposited in conformity, wherein the second spacing layer 31 is etched back in an anisotropic RIE step for so long until it remains on the side walls of topography steps. The first spacing layer 30 serves as a stop layer for the etching to avoid damage to the epitaxial layer 4.

It is an advantage of using the spacing layer 30, that it is used in the bipolar area additionally for isolating between a base terminal and the emitter, as will be explained below. Thereby, the parallelism of the method increases, wherein by the saved deposition of one or several layers, a thermal stress of the devices is reduced in comparison to known methods.

FIG. 21 shows the MOS area and the bipolar area after performing the etching back of the second spacing layer 31. The first spacing layer 30 extends continuously across the MOS area and the bipolar area and across the side walls of topography steps. The second spacing layer 31 is formed on the side wall of topography steps, i.e. at the side walls of the gate electrode, the window and topography step of layers 20, 21a, 21b and 22, on the first spacing layer.

In a next step, the first spacing layer 30 is selectively thinned to a remaining thickness of about 10 nm, to the second spacing layer 31.

FIG. 22 shows the MOS area and the bipolar area after performing this production step. The layer sequence of the first spacing layer 30 and the second spacing layer 31 disposed on the side on the gate electrode acts as a spacing barrier in the following doping step, for avoiding a full coverage of the LDD areas 29 by the HDD areas 32.

Afterwards, the HDD areas 32 are formed by implantation and a subsequent tempering. By the tempering, the dopant of the NPN base is diffused so far into the substrate, that the emitter, diffused in from the substrate surface in a later step, does not cover the base.

In the case, that apart from the described NMOS transistor, a PMOS transistor is produced as well, the dopant for the p doped source/drain areas of the PMOS transistor is implanted.

It is a significant advantage of the method that the doping of the source, drain and gate areas of the MOS transistor is performed after doping the collector and base areas of the bipolar transistor. In the case of doping the source, drain and gate areas prior to doping the collector and base areas, the additional temperature stresses make a specific setting of dopant distributions, which typically comprise boron, more difficult or impede it, which leads to a deterioration of the MOS transistor. By avoiding this detrimental effect, the method can also be used for producing components with high temperature sensitivity, such as it is the case with the 0.25 μm CMOS technology.

Thereupon, the first spacing layer 30 is selectively thinned on the full area to the second spacing layer 31, until the isolation layer 26, which has already been removed in the bipolar area, is exposed in the MOS area.

Due to thinning the first spacing layer 30 to a remaining thickness of about 10 nm, after performing this etching step, the epitaxial layer 4 is exposed in the bipolar area.

Alternatively, in one embodiment, the etching of the remaining first spacing layer 30 can be limited to the bipolar area by a photoresist mask, to obtain the thin isolation layer 26 and the thinned first spacing layer 30 in the MOS area as a stop layer for the subsequent etching of a polysilicon layer still to be deposited.

In the above-described further alternative embodiment, where the thin isolation layer 26 has been removed both in the bipolar area and in the MOS area, the remaining first spacing layer 30 may only be removed in the bipolar area, since otherwise in the MOS area, the stop layer for etching the still to be deposited terminal layer 33 from polysilicon is missing.

In a further step, the spacer formed on the side walls is removed from the second spacing layer 31 selectively to the first spacing layer 30 and the substrate material.

FIG. 23 shows the MOS area and the bipolar area after performing the above-described steps. According to FIG. 23, the first spacing layer 30 is formed on the side walls of the gate electrode, the window in the bipolar area and the topography stage, which is formed by layers 20, 21*a*, 21*b* and 22.

In a next step, a terminal layer 33 of polysilicon with high n-doping is deposited on the full area and structured. The terminal layer 33 of polysilicon serves in the bipolar area as emitter and collector terminal, in the V PNP area as a base terminal and in the capacity area and the varactor area, respectively, as a terminal for the lower electrode. The thin isolation layer 26 is used in the MOS area as etch stop to the substrate.

In the alternative embodiment, wherein the thinned first spacing layer 30 exists in the MOS area, the thin isolation layer 26 and the thin first spacing layer 30 form the etch stop. The subsequent etching of the terminal layer 33 of polysilicon is made with a photoresist mask.

FIG. 24*a* shows the MOS area and the bipolar area after terminating the deposition and etching the terminal layer 33 of polysilicon. The n-doped terminal layer 33 of polysilicon extends in vertical direction substantially along the first spacing layer 30, which is disposed on the side walls of the window in the bipolar area and further along the surface of the NPN base area 27. As can be seen in the figure, the first spacing layer 30 disposed on the side provides an electrical insulation of the terminal layer 33 of polysilicon, which represents an emitter terminal, to the highly conductive layer 20, which represents a base terminal.

FIG. 24*b* shows the V PNP area in the process state of FIG. 24*a*. The terminal layer 33 of polysilicon provides a terminal for the V PNP transistor for the base area 16. The n-doped terminal layer 33 of polysilicon extends substantially along the spacing layer 30 disposed on the side and across the surface of the base area 16 and partly into the area of the adjacent isolation areas 5. As in FIG. 24*a*, the first spacing layer 30 provides in FIG. 24 also an electrical insulation, in this case between the terminal layer 33 of polysilicon acting as base terminal and the highly conductive layer 20, which represents an emitter terminal. Further, the terminal layer 33 of polysilicon is formed on the surface of the connection well 6, to provide a substrate contact for the V PNP bipolar transistor.

The simultaneous usage of the spacing layer 30 as spacer for doping the drain and source areas as well as side wall insulation of the base terminal, results in the advantage that depositing additional layers can be saved, whereby, on the one hand, the parallelism of the method is increased and, on the other hand, cover layers across the MOS and bipolar transistors do not have to be deposited, which have to be deposited in a successive processing of the MOS and bipolar devices for protecting the components, which grants a leak tightness in a wet-chemical etching.

As can be seen from the previous description and the figures, the topology between the bipolar area and the MOS area is kept so low until the termination of anisotropic etching steps, that a removal of parasitic spacers is not required.

Further, the method avoids forming an edge with a width of several μm between MOS and bipolar parts, which represents a further advantage of the invention in comparison to known methods and enables an area reduction of products.

Figure 24C:
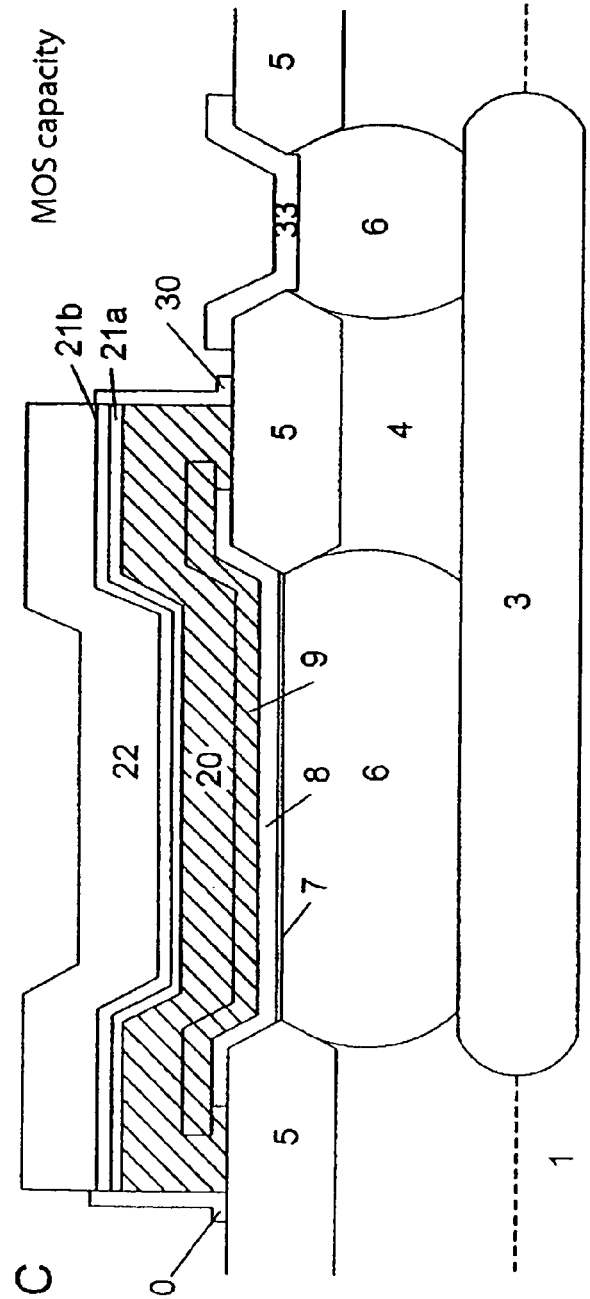

FIG. 24*c* shows the capacity area in the same process state of FIG. 24*a* and 24*b*. The terminal layer 33 of polysilicon is formed on the surface of the connection well 6, which provides a terminal to the lower electrode of the MOS capacity via the buried layer 3.

Figure 24D:
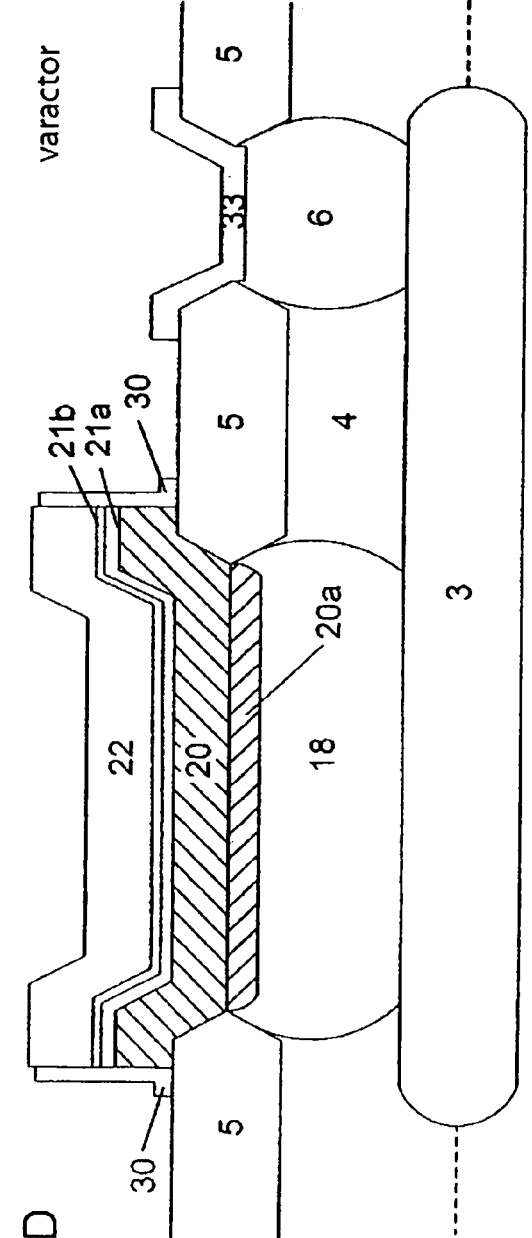

FIG. 24*d* shows the varactor area also in the production state of FIG. 24*a–c*. The terminal layer 33 of polysilicon is formed on the connection well 6 and provides a terminal to the n doped well 18 across the connection well 6 and the buried layer 3.

Figure 25:
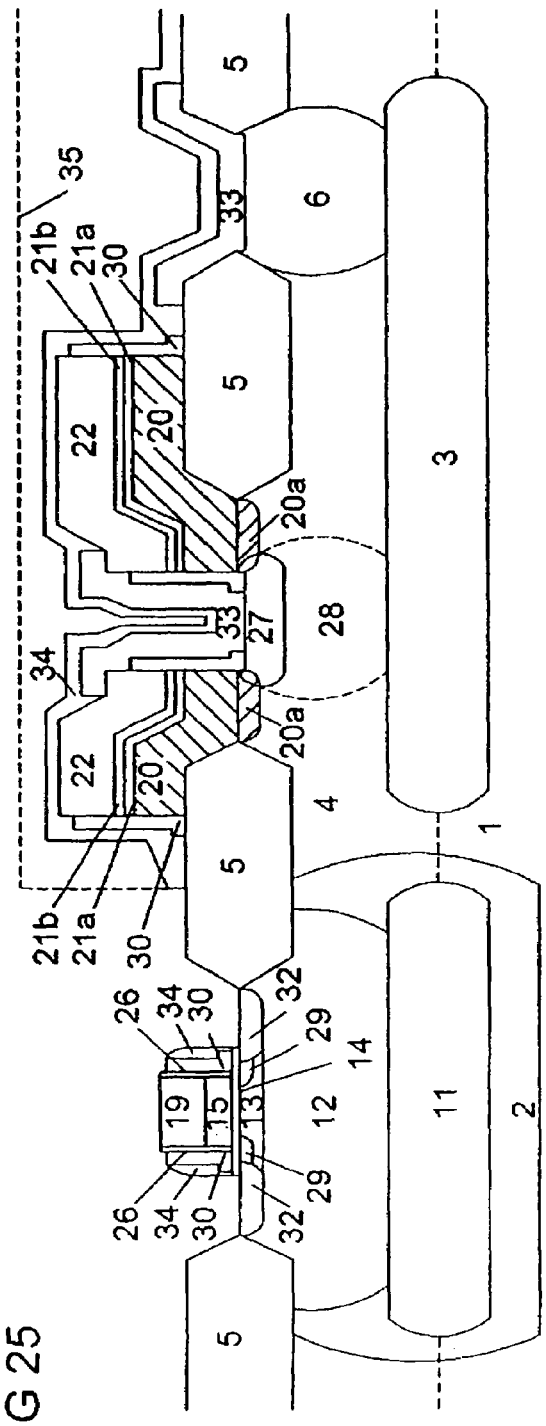

In order to provide conductive layers with a lower impedance, they are covered with a silicide layer in a subsequent method step. Therefore, a protective layer 34 is deposited and structured via a photoresist mask 35, as is shown in FIG. 25. Thereupon, the photoresist mask 35 is removed. To avoid shrinking of the protective layer 34 during the silicide formation, which would lead to peeling of the silicide layer from the protective layer 34, a tempering can be used. During this or a subsequent tempering, the dopant diffuses several 10 nm deep from the highly n-doped terminal layer 33 of polysilicon into the substrate lying below and forms a low-impedance connection to all n-doped contacts, such as the base terminal of the V PNP transistor, the terminal of the lower electrode of the MOS capacity and the cathode of the varactor, through the emitter diffusion layer 33a. In a subsequent deposition process, the silicide layer 36 is formed.

Figure 26:
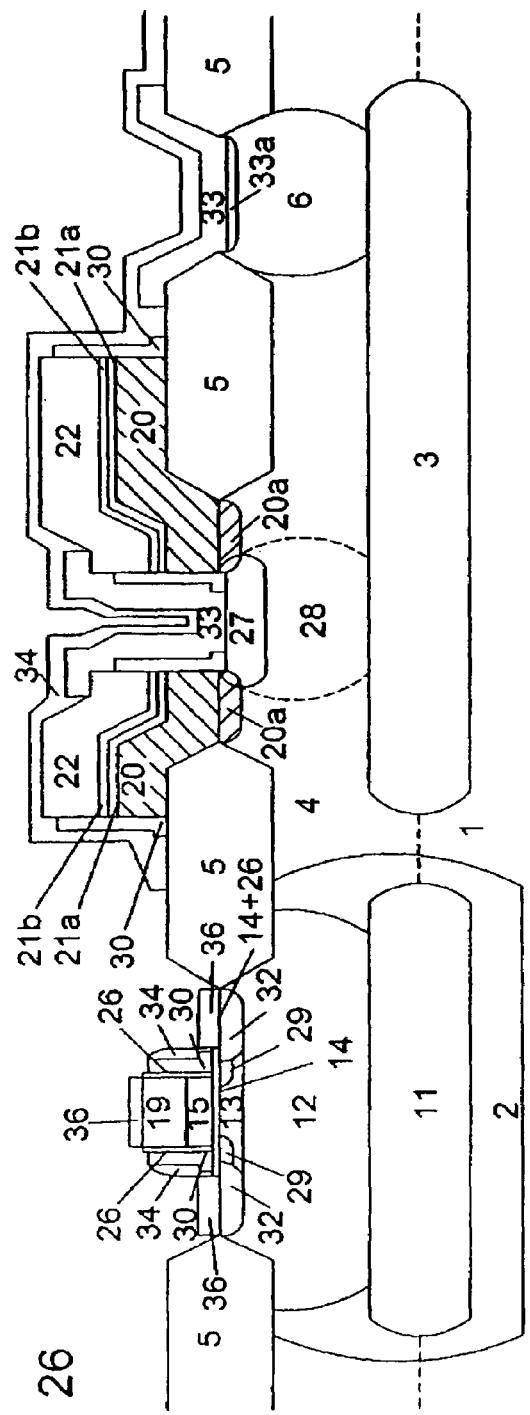

FIG. 26 shows the MOS area and the bipolar area after the termination of the silicide deposition, which is at the same time the last step in the production of the MOS transistor and the bipolar transistor. According to FIG. 26, the finished processed MOS transistor has the silicide layer 36 on the HDD areas of the source and drain areas. For depositing the silicide layer 36 on the source and drain areas, respectively, the spacing layer 26 disposed on the side and the protective layer 34 disposed above it form a spacer. Further, the silicon layer 36 is formed on the conductive layer 19 of the gate electrode. Particularly, the MOS transistor and the bipolar transistor have no additional cover layers apart from the protective layer, which would lead to a high mechanical stress and a deterioration of sensitive components.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. Method for parallel production of a MOS transistor in an MOS area of a substrate and a bipolar transistor in a bipolar area of the substrate, comprising:
    a) generating a MOS preparation structure in the MOS area, wherein the MOS preparation structure comprises an area provided for a channel, a gate dielectric, a gate electrode layer and a mask layer on the gate electrode layer;
    b) generating a bipolar preparation structure in the bipolar area, wherein the bipolar preparation structure comprises a conductive layer and a mask layer on the conductive layer;
    c) common structuring of the gate electrode layer and the conductive layer by using the mask layers for defining a gate electrode in the MOS area and a base terminal area and/or emitter collector terminal area in the bipolar area;
    d) thinning the mask layer in the area of the gate electrode, so that a thinned mask layer remains in the area of the gate electrode; and
    e) doping the conductive layer in the area of the gate electrode across the thinned mask layer.

2. Method according the claim 1, wherein the mask layer has a first and a second isolation layer.

3. Method according the claim 2, wherein in step d) a selective etching of the second isolation layer is performed down to the first isolation layer.

4. Method according to claim 1, wherein the mask layer in the MOS area and the mask layer in the bipolar area is generated by common depositing of at least one isolation layer.

5. Method according the claim 4, which further comprises the step of structuring the mask layer in the MOS area for defining the gate electrode and in the bipolar area for defining the base terminal area and/or collector area.

6. Method according to claim 1, further comprising a step of common depositing of the conductive layer in the bipolar area and at least part of the gate electrode layer in the MOS area.

7. Method according to claim 6, wherein the gate electrode layer has a first and a second gate electrode part layer, wherein the second gate electrode part layer is deposited in the bipolar area together with the conducive layer.

8. Method according to claim 1, wherein prior to the common structuring a thinning of the gate electrode layer is performed.

9. Method according to claim 1, wherein the step d) in the bipolar area a base terminal area and a window disposed therein for doping a collector area and/or a base area are structured from the conductive layer.

10. Method according to claim 1, wherein in step d) in the bipolar area, a collector terminal area and an emitter terminal area are structured from the conductive layer.

11. Method according to claim 1, wherein on the mask layer an antireflection layer is generated.

12. Method according to claim 1, further comprising, after step d), doping of a collector area and/or a base area in the bipolar area, and a common doping of a source area and/or drain area in the channel area and the gate electrode.

13. Method according claim 1, wherein step d) further comprises simultaneous etching of the gate electrode layer and conductive layer.

14. Method according to claim 1, further comprising a step of simultaneously generating isolating spacing layers on side walls of the gate electrode layer in the MOS area and the conductive layer in the bipolar area, wherein the isolating spacing layers in the MOS area serve for the definition of areas to be doped in the MOS area and for the isolation of a base area and an emitter area in the bipolar area.

15. Method according to claim 14, wherein the step of simultaneously generating spacing layers comprises applying first and second spacing layers and a selective etching of the first spacing layer and the second spacing layer.

16. Method according to claim 1, further comprising a parallel generation of one or several devices of the group, which comprises a varactor diode and a MOS capacitor.

* * * * *